US012696677B2

(12) United States Patent
Shin et al.

(10) Patent No.: US 12,696,677 B2
(45) Date of Patent: Jul. 28, 2026

(54) DISPLAY DEVICE

(71) Applicant: Samsung Display Co., Ltd., Yongin-si (KR)

(72) Inventors: Dong Chul Shin, Hwaseong-si (KR); In Seon Yoon, Suwon-si (KR); Jang Yeol Yoon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 528 days.

(21) Appl. No.: 17/673,305

(22) Filed: Feb. 16, 2022

(65) Prior Publication Data

US 2022/0262874 A1 Aug. 18, 2022

(30) Foreign Application Priority Data

Feb. 18, 2021 (KR) ........................ 10-2021-0022200

(51) Int. Cl.
| | |
|---|---|
| *H10K 59/124* | (2023.01) |
| *H10K 59/80* | (2023.01) |
| *H10K 59/88* | (2023.01) |
| *H10K 77/00* | (2023.01) |

(Continued)

(52) U.S. Cl.
CPC ......... *H10K 77/111* (2023.02); *H10K 59/124* (2023.02); *H10K 59/80521* (2023.02); *H10K 59/88* (2023.02); *H10K 77/00* (2023.02); *H10K 2102/311* (2023.02)

(58) Field of Classification Search
CPC .............. H10K 59/131; H10K 77/111; H10K 2102/311; H10K 59/124; H10K 59/80521; H10K 59/88; H10K 77/00
See application file for complete search history.

(56) References Cited

U.S. PATENT DOCUMENTS

| | | | |
|---|---|---|---|
| 9,799,708 B2 | 10/2017 | Hong et al. | |
| 10,056,435 B2 | 8/2018 | Hong et al. | |
| 10,461,142 B2 | 10/2019 | Hong et al. | |

(Continued)

FOREIGN PATENT DOCUMENTS

| | | |
|---|---|---|
| CN | 105977276 A | 9/2016 |
| CN | 107994052 A | 5/2018 |

(Continued)

OTHER PUBLICATIONS

Chinese Office Action corresponding to CN Application No. 202210133390.4, dated Apr. 13, 2026 (8 pages).

*Primary Examiner* — Matthew C Landau
*Assistant Examiner* — David W Ward
(74) *Attorney, Agent, or Firm* — Womble Bond Dickinson (US) LLP

(57) ABSTRACT

In a display device including a first area and a plurality of second areas spaced apart from each other by the first area, the display device includes: a substrate including a plurality of islands distinguished by a plurality of cutouts, and a plurality of bridges respectively adjacent to the plurality of islands; a common electrode on the substrate in the first area; and a dummy conductive pattern on the substrate in the second area, physically separated from the common electrode, and including a same material as the common electrode, wherein the first area is over the plurality of islands and the plurality of bridges, and each of the plurality of second areas is around at least one of both ends of the cutout.

19 Claims, 13 Drawing Sheets

(51) Int. Cl.
  *H10K 77/10*      (2023.01)
  *H10K 102/00*     (2023.01)

(56) References Cited

U.S. PATENT DOCUMENTS

| | | | |
|---|---|---|---|
| 10,608,071 B2 | 3/2020 | Hong et al. | |
| 10,644,079 B2 | 5/2020 | Hong et al. | |
| 10,748,982 B2 | 8/2020 | Hong et al. | |
| 11,127,921 B2 | 9/2021 | Jung | |
| 11,152,434 B2 | 10/2021 | Hong et al. | |
| 11,251,255 B2 | 2/2022 | Hong et al. | |
| 11,430,851 B2 | 8/2022 | Hong et al. | |
| 11,600,797 B2 | 3/2023 | Jung | |
| 11,683,968 B2 | 6/2023 | Hong et al. | |
| 11,910,673 B2 | 2/2024 | Hong et al. | |
| 12,089,456 B2 | 9/2024 | Hong et al. | |
| 12,279,495 B2 | 4/2025 | Hong et al. | |
| 12,349,560 B2 | 7/2025 | Park et al. | |
| 12,563,896 B2 | 2/2026 | Hou et al. | |
| 2006/0289997 A1* | 12/2006 | Tomita | H01L 23/5283 257/E23.152 |
| 2018/0052493 A1* | 2/2018 | Hong | G06F 3/044 |
| 2018/0120997 A1 | 5/2018 | Moon et al. | |
| 2018/0182992 A1* | 6/2018 | Seo | H10K 59/50 |
| 2019/0018518 A1 | 1/2019 | Choi et al. | |
| 2019/0296097 A1* | 9/2019 | Hong | H10K 59/352 |
| 2020/0006697 A1 | 1/2020 | Jung | |
| 2020/0212132 A1* | 7/2020 | Kim | H10K 59/124 |
| 2021/0202895 A1* | 7/2021 | Kang | H10K 50/844 |
| 2022/0028945 A1* | 1/2022 | Cao | H10K 59/131 |
| 2022/0035503 A1* | 2/2022 | Liu | G06F 3/04164 |
| 2022/0181413 A1* | 6/2022 | Lee | H10K 59/124 |
| 2022/0320465 A1* | 10/2022 | Hou | H10K 59/8731 |
| 2022/0344612 A1* | 10/2022 | Jia | H10K 71/00 |
| 2023/0031474 A1* | 2/2023 | Qian | H10K 59/1216 |
| 2023/0276678 A1 | 8/2023 | Hong et al. | |
| 2023/0413630 A1* | 12/2023 | Yamazaki | H10D 86/423 |
| 2025/0248254 A1 | 7/2025 | Park et al. | |

FOREIGN PATENT DOCUMENTS

| | | |
|---|---|---|
| CN | 109346504 A | 2/2019 |
| CN | 110364548 A | 10/2019 |
| CN | 112185997 A | 1/2021 |
| CN | 113924654 A | 1/2022 |
| JP | 2019-79963 A | 5/2019 |
| KR | 10-2018-0045968 A | 5/2018 |
| KR | 10-2019-0112880 A | 10/2019 |
| KR | 10-2020-0003337 A | 1/2020 |

* cited by examiner

PX: PX1, PX2, PX3
: AR1
: AR2

OL: ETL, EL, HTL
SDL: SDL1, SDL2, SDL3

DISPLAY DEVICE

CROSS-REFERENCE TO RELATED APPLICATION

The present application claims priority to and the benefit of Korean Patent Application No. 10-2021-0022200 filed on Feb. 18, 2021 in the Korean Intellectual Property Office, the entire content of which is incorporated herein by reference.

BACKGROUND

1. Field

Aspects of some embodiments of the present disclosure relate to a display device.

2. Description of the Related Art

With the advance of the information-oriented society, more and more demands are placed on display devices for displaying images in various ways. For example, display devices may be utilized in various electronic devices such as smartphones, digital cameras, laptop computers, navigation devices, and smart televisions.

As a display device, various types of display devices such as a liquid crystal display (LCD) device, an organic light emitting display (OLED) device and the like have been used. Among the display devices, the organic light emitting display device displays images using organic light emitting elements that generate light by recombination of electrons and holes. The organic light emitting display device includes a plurality of transistors that provide a driving current to the organic light emitting element.

Recently, the demand for a flexible display device is increasing. Among flexible display devices, a stretchable display device capable of being stretched or contracted has various applications. The stretchable display device is also used as a display device whose purpose is to stretch, but may also be applied to other flexible display devices, foldable display devices, rollable display devices, or the like for effective bending, folding, or rolling.

The above information disclosed in this Background section is only for enhancement of understanding of the background and therefore the information discussed in this Background section does not necessarily constitute prior art.

SUMMARY

Aspects of embodiments according to the present disclosure include a display device capable of improving an opening ratio and suppressing or preventing defects such as cracks that may occur in a cathode electrode.

However, aspects of embodiments according to the present disclosure are not restricted to those specifically described herein. The above and other aspects of embodiments according to the present disclosure will become more apparent to one of ordinary skill in the art to which the present disclosure pertains by referencing the detailed description of the present disclosure given below.

According to some embodiments, a display device includes a first area and a plurality of second areas separated and spaced apart from each other by the first area, the display device includes a substrate including a plurality of islands distinguished by a plurality of cutouts, and a plurality of bridges respectively adjacent to the plurality of islands, a common electrode on the substrate in the first area, and a dummy conductive pattern on the substrate in the second area, physically separated from the common electrode, and including the same material as the common electrode, wherein the first area is over the plurality of islands and the plurality of bridges, and each of the plurality of second areas is around at least one of both ends of the cutout.

According to some embodiments a display device includes a first area and a plurality of second areas separated and spaced apart from each other by the first area, the display device includes a substrate including a plurality of islands distinguished by a plurality of cutouts, and a plurality of bridges respectively disposed between two adjacent islands of the plurality of islands adjacent to each other, a first planarization layer on the substrate in the first area, a first passivation layer on the first planarization layer, a common electrode on the first passivation layer, and a dummy conductive pattern on the substrate in the second area, physically separated from the common electrode, and including the same material as the common electrode, wherein the first area is over the plurality of islands and the plurality of bridges, and the common electrode is located at a position higher than the dummy conductive pattern with respect to one surface or other surface of the substrate.

In the display device according to some embodiments, the opening ratio of the display device may be improved, and defects such as cracks that may occur in the cathode electrode may be suppressed or prevented.

However, the features of embodiments according to the present disclosure are not limited to the aforementioned features, and various other features are included in the present specification.

BRIEF DESCRIPTION OF THE DRAWINGS

The above and other aspects and features of the present disclosure will become more apparent by describing in more detail aspects of some embodiments thereof with reference to the attached drawings, in which.

DETAILED DESCRIPTION

Aspects of some embodiments of the present invention will now be described more fully hereinafter with reference to the accompanying drawings, in which aspects of some embodiments of the invention are shown. This invention may, however, be embodied in different forms and should not be construed as limited to the embodiments set forth herein. Rather, these embodiments are provided so that this disclosure will be thorough and complete, and will more fully convey the scope of embodiments according to the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments will be described in detail with reference to the accompanying drawings.

Figure 1:
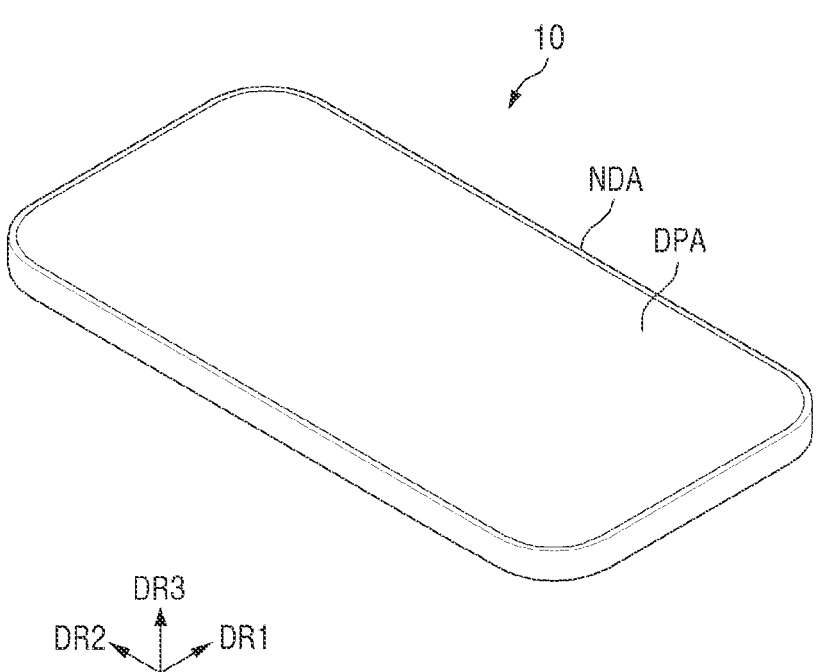
FIG. 1 is a perspective view of a display device according to some embodiments.

FIG. 1 is a perspective view of a display device according to some embodiments.

Throughout the specification, a first direction DR1 and a second direction DR2 cross each other in different directions. In the drawings, it is illustrated that the first direction DR1 indicates a horizontal direction in a plan view (e.g., a view perpendicular or normal with respect to a display surface or a plane parallel to the first direction DR1 and the second direction DR2) and the second direction DR2 indicates a vertical direction in a plan view, respectively, but embodiments according to the present disclosure are not limited thereto. In the following embodiments, one side of the first direction DR1 represents a direction toward the right side in a plan view, and the other side of the first direction DR1 represents a direction toward the left side in a plan view. One side of the second direction DR2 represents an upward direction in a plan view, and the other side of the second direction DR2 represents a downward direction in a plan view.

A third direction DR3 is a direction intersecting the plane on which the first direction DR1 and the second direction DR2 are located and perpendicularly intersects both the first direction DR1 and the second direction DR2. It should be understood, however, that a direction mentioned in the embodiments refers to a relative direction and the embodiments are not limited to the direction mentioned.

Unless otherwise defined, with respect to the third direction DR3, the terms "above," "top surface," and "upper side" as used herein refer to a display surface's side of a display device 10 or a display panel, and the terms "below," "bottom surface," and "lower side" as used herein refer to a side opposite to the display surface of the display device 10 or the display panel.

Referring to FIG. 1, the display device 10 is a device for displaying a moving image or a still image, and includes a display panel. Examples of the display panel may include not only a self-light emitting display panel such as an organic light emitting display (OLED) panel, an inorganic light emitting display (LED) panel, a quantum dot light emitting display (QD-LED) panel, a micro-LED display panel, a nano-LED display panel, a plasma display panel (PDP), a field emission display (FED) panel and a cathode ray tube (CRT) display panel, but also a light receiving display panel such as a liquid crystal display (LCD) panel and an electrophoretic display (EPD) panel.

Hereinafter, the organic light emitting display panel will be described as an example of the display panel, and the organic light emitting display panel applied to the embodiments will be simply referred to as a display panel unless special distinction is required. However, the embodiments are not limited to the organic light emitting display panel, and other display panels mentioned above or known in the art may be applied within the same scope of technical spirit.

The display device 10 may further include a touch member (or touch panel). The touch member may be integrated with the display panel or may be provided as a panel separate from the display panel. The touch member may be configured to sense a touch or proximity input from a user (e.g., a user's finger or a stylus).

The display device 10 may further include one or more sensors, various controllers, housings, and other components in addition to the display panel and the touch member. When a device includes a display area DPA for displaying an image or video, it may be interpreted as corresponding to the display device 10 regardless of the main purpose of the device, an added function or name, or the like. Examples of the display device 10 may include, but are not limited to, a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, various medical devices, various inspection devices, various household appliances such as a refrigerator and a washing machine including a display unit, an Internet-of-Things device, and the like.

The display device 10 may include the display area DPA and a non-display area NDA. The display area DPA is an area in which an image is displayed and is an active region, and the non-display area NDA is an area in which an image is not displayed and may be an inactive region. The display area DPA may have a rectangular planar shape, but is not limited thereto, and may have various planar shapes such as a square, a rhombus, a circle, and an ellipse.

The non-display area NDA may be arranged around the display area DPA. The non-display area NDA may completely or partially surround the display area DPA. In the non-display area NDA, a signal wire for applying a signal to the display area DPA or transmitting a signal measured in the display area DPA may be arranged. The non-display area NDA, which is an inactive region, may correspond to a bezel area of the display device 10. The drawings illustrate a case in which the non-display area NDA is arranged around all sides of the display area DPA of a rectangular shape, but the present disclosure is not limited thereto, and the non-display area NDA may not be arranged around some sides, or the non-display area NDA may be omitted in a plan view in such a way that the non-display area NDA is bent toward the rear surface of the display area DPA and overlaps the display area DPA in the thickness direction.

Figure 4:
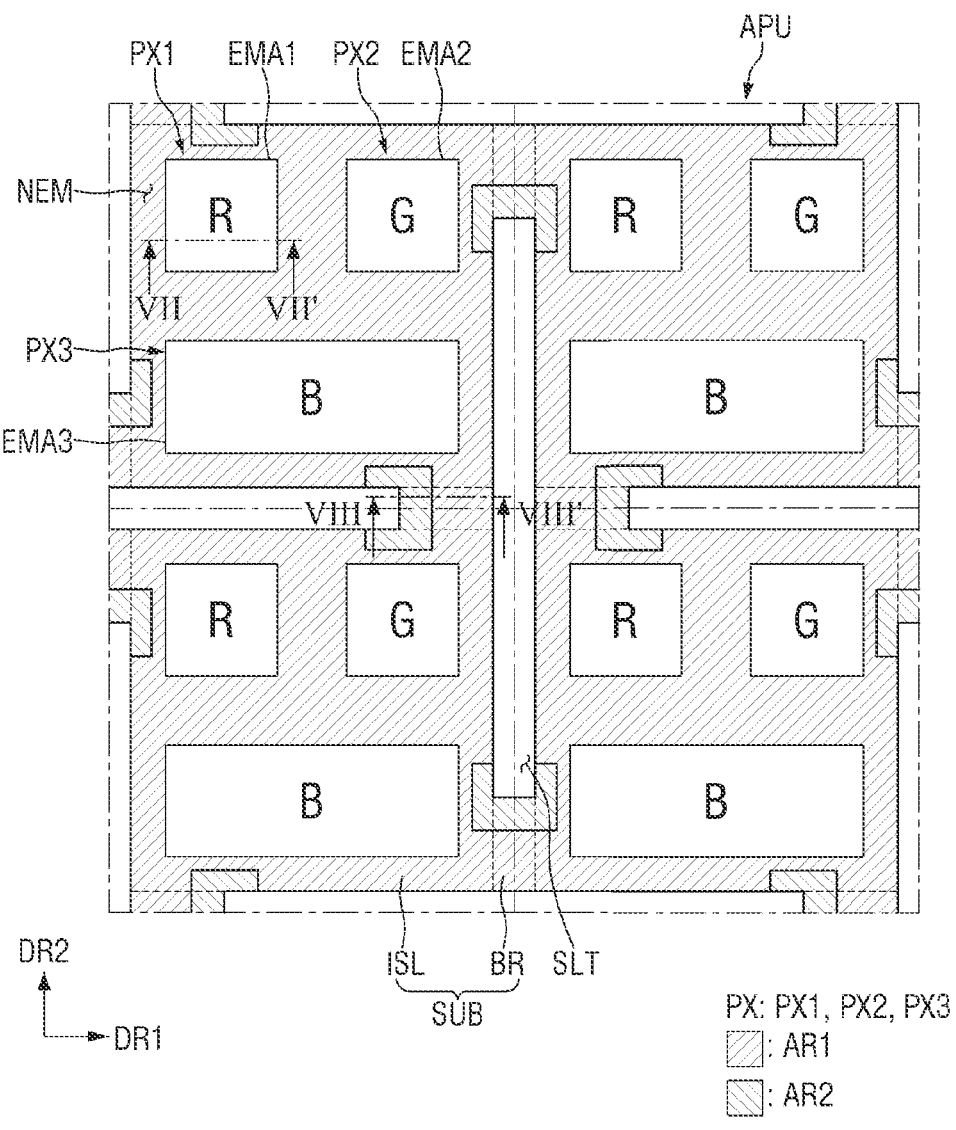
FIG. 4 is a schematic diagram illustrating an arrangement of a substrate island in a partial area of a display device according to some embodiments.

The display area DPA includes a plurality of pixels PX (see FIG. 4). The pixels PX (see FIG. 4) are arranged in a matrix shape. The pixel PX (see FIG. 4) may include a first color pixel, a second color pixel and a third color pixel. The first color pixel may be a red pixel, the second color pixel may be a green pixel, and the third color pixel may be a blue pixel. According to some embodiments, the arrangement of the pixels PX (see FIG. 4) may be that pixels of the same color are arranged along the second direction DR2 that is a column extension direction, and may have a stripe arrangement method in which red, green, and blue pixels are alternately arranged in that order along the first direction DR1 that is a row extension direction, but the arrangement of the pixels PX (see FIG. 4) is not limited to that illustrated. For example, the arrangement of the pixels PX (see FIG. 4) may be a Pentile® arrangement method in which each pixel PX (see FIG. 4) is formed in a rhombus shape, and a red pixel and a blue pixel are radially arranged around a green pixel. In addition, the pixel PX (see FIG. 4) may further include a white pixel in addition to red, green, and blue pixels.

The display device 10 may be a flexible device. The display device 10 may be stretched, curved, bent, folded, or rolled. The flexibility of the display device 10 may be implemented through a flexible substrate. The flexible substrate may include a flexible polymer. Examples of the flexible polymer include polyimide or polyester (e.g., polyethylene terephthalate, polybutylene phthalate, polyethylene naphthalate, etc.), polystyrene, polycarbonate, polyether sulfone, polyarylate, polycycloolefin, norbornen resin, poly (chlorotrifluoroethylene), and polymethyl methacrylate.

Figure 2:
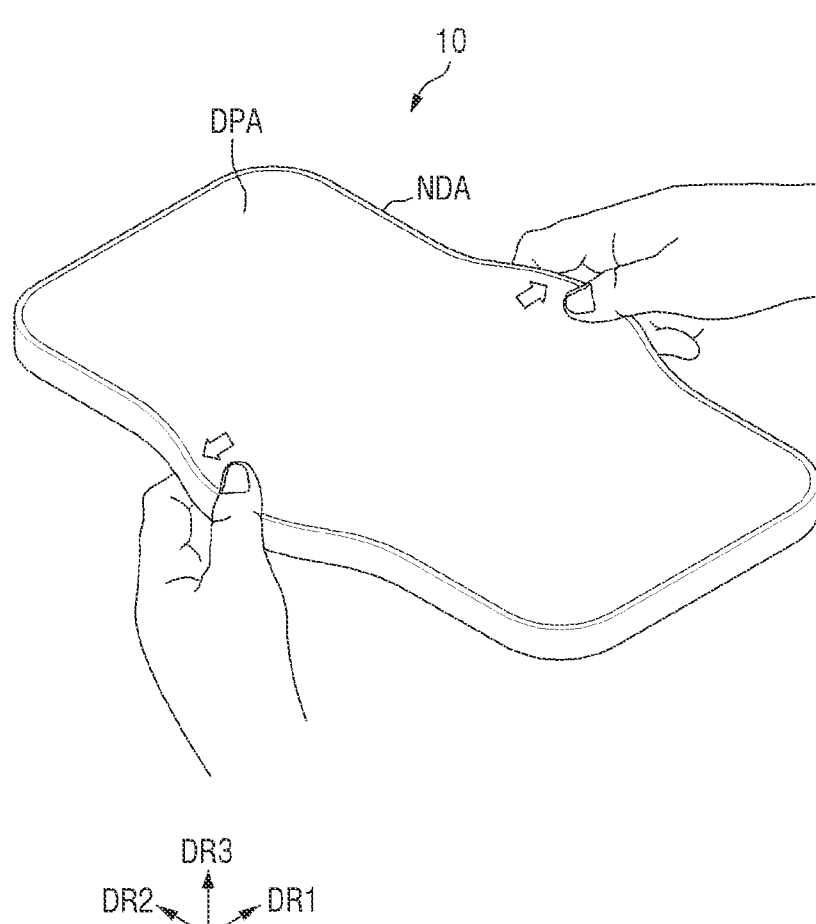
FIG. 2 is a perspective view illustrating a state in which the display device of FIG. 1 is stretched in a horizontal direction.
Figure 3:
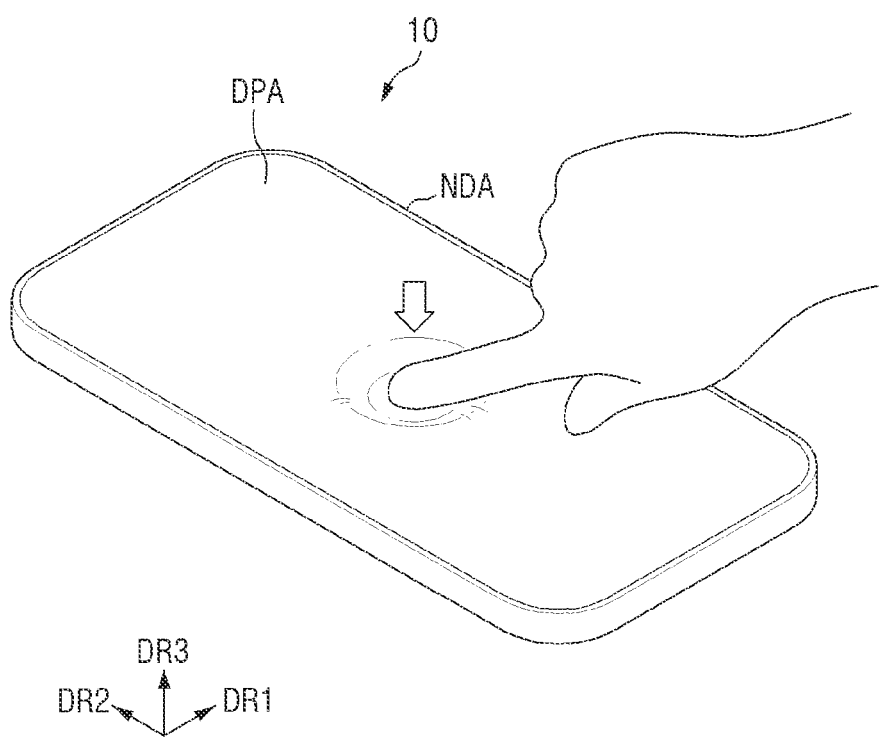
FIG. 3 is a perspective view illustrating a state in which the display device of FIG. 1 is locally stretched.

FIGS. 2 and 3 illustrate an application example of a stretchable display device as an example of a flexible display device. FIG. 2 is a perspective view illustrating a state in which the display device of FIG. 1 is stretched in a horizontal direction. FIG. 3 is a perspective view illustrating a state in which the display device of FIG. 1 is locally stretched.

Referring to FIG. 2, the display device 10 may be stretched in a horizontal direction. For example, by grabbing the edge of the display device 10 and extending the edge to both sides, the display device 10 may be stretched in that direction. According to the stretching, the area of the display device 10 in a plan view may increase. In the drawing, the state of stretching in the first direction DR1 is illustrated, but it may be stretching in the second direction DR2, stretching in both the second direction DR2 and the first direction DR1, or stretching in other horizontal directions. The stretching of the display device 10 is performed by an external force, and when the external force is removed, it may contract and return to its original state.

Referring to FIG. 3, the display device 10 may be locally stretched while maintaining the overall planar area. That is, as illustrated in FIG. 3, when the display device 10 is pressed in the third direction DR3, which is the thickness direction, the display device 10 may be locally stretched around the pressed point. In this case, the direction in which the display device 10 is stretched is a direction inclined with respect to the horizontal direction, and the entire planar area of the display device 10 may be kept the same. When the pressing force is removed, the stretched portion may contract again and return to its original state.

The stretching of FIG. 2 and the stretching of FIG. 3 may be performed at the same time. For example, with respect to the pressure in the thickness direction, while it may be locally stretched in a direction inclined with respect to the horizontal direction, the planar area may be further increased as a whole.

Figure 5:
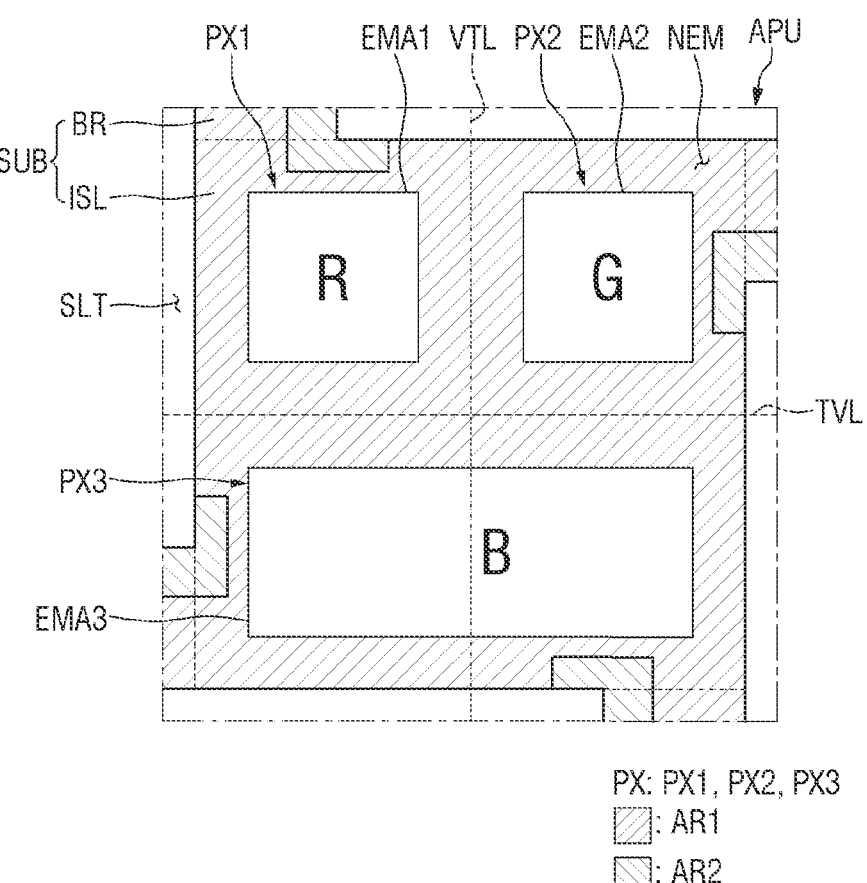
FIG. 5 is a schematic diagram of an array repeating unit according to some embodiments.

As described above, when the display device 10 is stretched or contracted, the substrate of the display device 10 and thin films arranged thereon are subjected to stress. In order to alleviate such stretching stress, the substrate of the display device 10 may include a cutout SLT (see FIG. 5). FIGS. 4 and 5 are referred to for a more detailed description thereof.

FIG. 4 is a schematic diagram illustrating an arrangement of a substrate island in a partial area of a display device according to some embodiments. FIG. 5 is a schematic diagram of an array repeating unit according to some embodiments.

Referring to FIGS. 4 and 5, the display device 10 (see FIG. 1) according to some embodiments may include a substrate SUB supporting each component arranged thereon. The substrate SUB may have a plurality of stacked structures, and in this case, an inorganic layer and/or an amorphous silicon layer may be further arranged between each layer. The substrate SUB may include a flexible polymer.

The substrate SUB may include a plurality of islands ISL distinguished by the cutout SLT and a plurality of bridges BR connecting the islands ISL adjacent to each other. In an embodiment, the plurality of bridges BR may be respectively adjacent to the plurality of islands ISL. The substrate SUB may have a shape in which one island ISL and bridges BR connected to the edge of the island ISL are arranged along the first direction DR1 and the second direction DR2.

Each of the plurality of bridges BR may protrude in the first direction DR1 or the second direction DR2 from one island ISL toward an adjacent island ISL. The cutout SLT may be an opening formed by removing a part of the substrate SUB. In the cutout SLT, the substrate SUB may not be arranged, and moreover, separate stacked structures arranged on the substrate SUB may not be arranged. That is, the cutout SLT may be an opening formed by removing a part of each of the substrate SUB and the stacked structure arranged on the substrate SUB.

The island ISL and the bridge BR may be integrally formed, but embodiments according to the present disclosure are not limited thereto. The islands ISL adjacent to each other may be connected to each other by the bridge BR in at least a portion thereof, and may be spaced apart from each other to face each other in other portions thereof. The cutout SLT may be located in an area where the islands ISL adjacent to each other are spaced apart from each other to face each other. That is, the islands ISL adjacent to each other may be partially separated from each other by the cutout SLT.

The arrangement patterns of the plurality of islands ISL and the bridge BR may be repeatedly arranged based on substantially the same basic unit (hereinafter, an array repeating unit APU). The array repeating units APU may have substantially the same island ISL and bridge BR arrangement, and moreover, wires, electrodes, or the like arranged in a corresponding area may also have substantially the same pattern and the same arrangement. The array repeating unit APU may have a square or rectangular shape.

The array repeating units APU may be arranged in succession along the horizontal direction (first direction DR1) and the vertical direction (second direction DR2), but the neighboring array repeating units APU may have a symmetrical relationship with respect to a line perpendicular to the adjacent direction. For example, the neighboring array repeating units APU in the second direction DR2 may have a line-symmetric shape with respect to a boundary line in the first direction DR1 that traverses therebetween (or boundary). In addition, the neighboring array repeating units APU in the first direction DR1 may have a line-symmetric shape with respect to a boundary line in the second direction DR2 that traverses therebetween.

The island ISL is located in the center of the array repeating unit APU. The island ISL is arranged in one array repeating unit APU, and may be connected to the island ISL of the neighboring array repeating unit APU through the bridge BR. Each of the islands ISL may have a quadrangular shape in a plan view, but is not limited thereto.

The bridge BR may have a shape protruding to the top (one side of the second direction DR2), the bottom (the other side of the second direction DR2), the left (the other side of the first direction DR1), and the right (one side of the first direction DR1) from the island ISL in a plan view. Each bridge BR is connected to the island ISL.

The center of gravity of the bridge BR protruding to the left side from the island ISL may be arranged to be biased to either the upper side or the lower side than to the horizontal center line TVL, and the center of gravity of the bridge BR protruding to the right side from the island ISL may be arranged to be biased to the remaining one of the upper side and the lower side than to the horizontal center line TVL. The bridge BR protruding to the left side from the island ISL and the bridge BR protruding to the right side from the island ISL may have generally similar areas, and may generally have a point symmetric relationship with respect to the center of the array repeating unit APU.

The center of gravity of the bridge BR protruding to the lower side from the island ISL may be arranged to be biased to either the left side or the right side than to the vertical center line VTL, and the center of gravity of the bridge BR protruding to the upper side from the island ISL may be arranged to be biased to the remaining one of the left side and the right side than to the vertical center line VTL. The bridge BR protruding to the lower side from the island ISL and the bridge BR protruding to the upper side from the island ISL may have generally similar areas, and may generally have a point symmetric relationship with respect to the center of the array repeating unit APU.

Another island ISL adjacent to the island ISL may be connected to any one of the bridge BR protruding to the left side from the island ISL, the bridge BR protruding to the right side from the island ISL, the bridge BR protruding to the lower side from the island ISL, and the bridge BR protruding to the upper side from the island ISL. The bridge BR connecting the islands ISL arranged respectively on the array repeating units APU adjacent to each other may cross the array repeating units APU adjacent to each other. That is, the islands ISL located respectively in the adjacent array repeating units APU may be interconnected through the bridge BR crossing the adjacent array repeating units APU.

The cutout SLT penetrates the substrate SUB in the thickness direction. That is, the substrate SUB may be physically removed from the cutout SLT. A material constituting the substrate SUB may not be present in the cutout SLT. The cutout SLT in which the substrate constituent material does not exist may be deformed more freely in width with respect to stretching than the portion filled with the constituent material of the substrate SUB. Accordingly, when partially stretched, the display device 10 (see FIG. 1)

may be relatively easily stretched due to the cutout SLT, so that strain applied to the substrate SUB may be reduced.

In addition, the cutout SLT may penetrate not only the substrate SUB but also all of the components such as an insulating layer arranged on the substrate SUB in the thickness direction. That is, the cutout SLT may be completely emptied into an empty space. However, embodiments according to the present disclosure are not limited thereto. In this case, when partially stretched, the display device 10 (see FIG. 1) is relatively more easily stretched due to the cutout SLT, so that strain applied to the display panel (or substrate SUB) of the display device 10 (see FIG. 1) may be further reduced.

When the substrate SUB is stretched, the distance between the islands ISL may increase as the bridges BR are stretched. That is, the area of the cutout SLT may increase. The shape of each island ISL may not be deformed. When the shape of the island ISL is not deformed, the width and thickness of the island ISL do not increase or decrease, and thus the structure of the pixel PX formed on the island ISL may not be deformed. However, embodiments according to the present disclosure are not limited thereto, and the shape of each island ISL may be deformed.

The substrate SUB may have a structure in which the entirety thereof is stretchable, but embodiments according to the present disclosure are not limited thereto, and in some cases, the substrate SUB may have a structure in which only at least a part thereof is stretchable.

One or more of a plurality of pixels PX may be arranged in the array repeating unit APU. For example, basic pixel groups representing full colors may be arranged in the array repeating unit APU. As illustrated in FIG. 5, three pixels PX1, PX2, and PX3 of red, green, and blue, which are basic units representing full colors, may be arranged in one array repeating unit APU. As another example, four pixels of red, green, blue, and white may be arranged in one array repeating unit APU. As still another example, two pixels of red and green, or blue and green may be arranged, or four pixels of red, green, blue, and green may be arranged, in one array repeating unit APU. In addition, two or more basic pixel groups that represent full colors may be arranged in one array repeating unit APU, and various modifications thereof are possible.

Each pixel PX in the array repeating unit APU includes a pixel electrode. The pixel electrode of the first pixel PX1, the pixel electrode of the second pixel PX2, and the pixel electrode of the third pixel PX3 may be connected to different driving transistors, respectively to receive separate voltages.

Each pixel electrode may be arranged inside the island ISL of the substrate SUB. Each pixel electrode may not be arranged on the cutout SLT of the substrate SUB. According to some embodiments, the pixel electrodes of the first pixel PX1, the second pixel PX2, and the third pixel PX3 arranged in one array repeating unit APU may be all arranged on one island ISL.

In order to drive each pixel electrode of the pixel PX, a pixel circuit including a plurality of wires and transistors is required. To this end, a plurality of wires, electrodes, insulating layers, semiconductor layers, and the like may be arranged on the substrate SUB. A plurality of wires, electrodes, insulating layers, semiconductor layers, and the like may be arranged not only on the island ISL but also on the bridge BR, but may not be arranged on the cutout SLT. However, embodiments according to the present disclosure are not limited thereto. For example, when the substrate SUB is removed from the cutout SLT, but an insulating layer or the like is arranged, a plurality of wires, electrodes, semiconductor layers, and the like may be arranged in the cutout SLT.

The display device 10 may further include a first emission area EMA1, a second emission area EMA2, a third emission area EMA3, and a non-emission area NEM. Although described later, the first to third emission areas EMA1, EMA2, and EMA3 and the non-emission area NEM may be distinguished by a pixel defining layer PDL (see FIG. 7).

The first to third emission areas EMA1, EMA2, and EMA3 and the pixels PX1, PX2, and PX3 may be arranged for each array repeating unit APU. The first to third emission areas EMA1, EMA2, and EMA3 and the pixels PX1, PX2, and PX3 may be arranged on each island ISL. The first emission area EMA1 may be the emission area of the first pixel PX1, the second emission area EMA2 may be the emission area of the second pixel PX2, and the third emission area EMA3 may be the emission area of the third pixel PX3. Each of the first to third emission areas EMA1, EMA2, and EMA3 may be distinguished by the non-emission area NEM. The first to third emission areas EMA1, EMA2, and EMA3 may have different shapes and sizes in a plan view, but are not limited thereto, and all may be the same.

Hereinafter, a pixel circuit of one pixel of each display device will be described with further reference to FIGS. 6 and 7.

Figure 6:
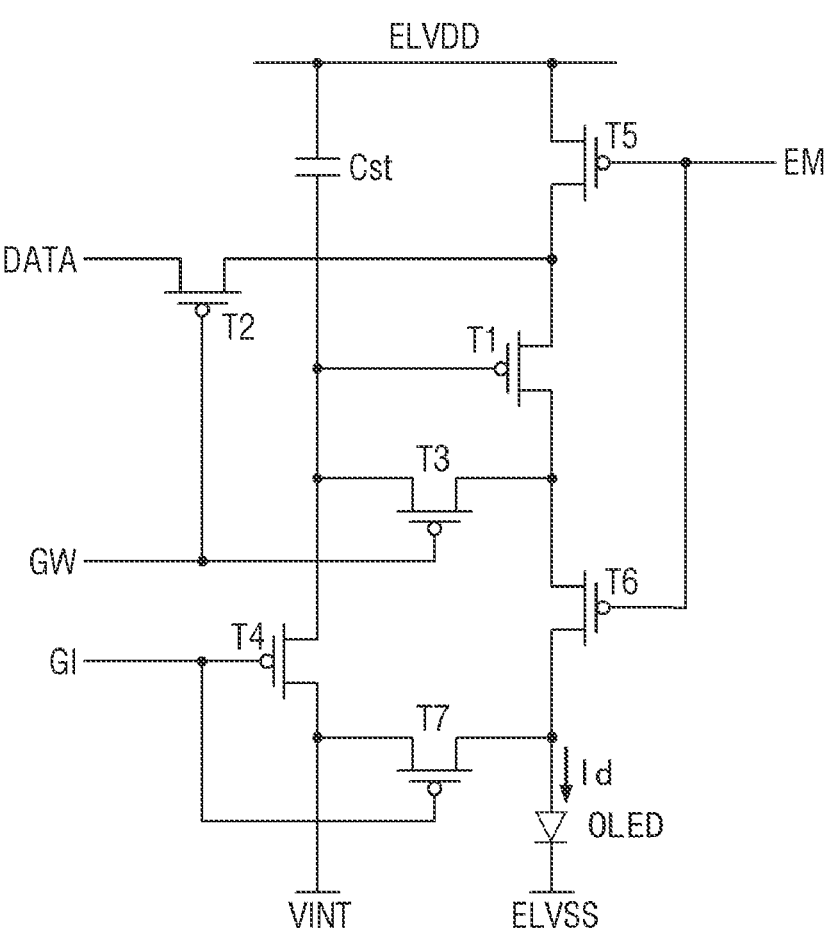
FIG. 6 is a circuit diagram of one pixel of a display device according to some embodiments.

FIG. 6 is a circuit diagram of one pixel of a display device according to some embodiments.

Referring to FIG. 6, a circuit of one pixel of the organic light emitting display device includes an organic light emitting diode OLED, a plurality of transistors T1 to T7, and a storage capacitor Cst. The circuit of one pixel is applied with a data signal DATA, a first scan signal GW, a second scan signal GI, an emission control signal EM, a first power voltage ELVDD, a second power voltage ELVSS, and an initialization voltage VINT. The data signal DATA may be provided through a data line DL in FIG. 7, the first scan signal GW and the second scan signal GI may be provided through a first scan line SL1 in FIG. 7 and a second scan line SL2 in FIG. 7, respectively, and the emission control signal EM may be provided through an emission signal control line EML in FIG. 7. Similarly, the first power voltage ELVDD and the initialization voltage VINT may be provided through a first power voltage line ELVDDL in FIG. 7 and an initialization power line VINTL in FIG. 7, respectively.

The organic light emitting diode OLED includes an anode electrode made of a pixel electrode PXE (see FIG. 7), a cathode electrode made of a common electrode CME (see FIG. 7), and an organic layer OL (see FIG. 7) interposed therebetween.

Figure 7:
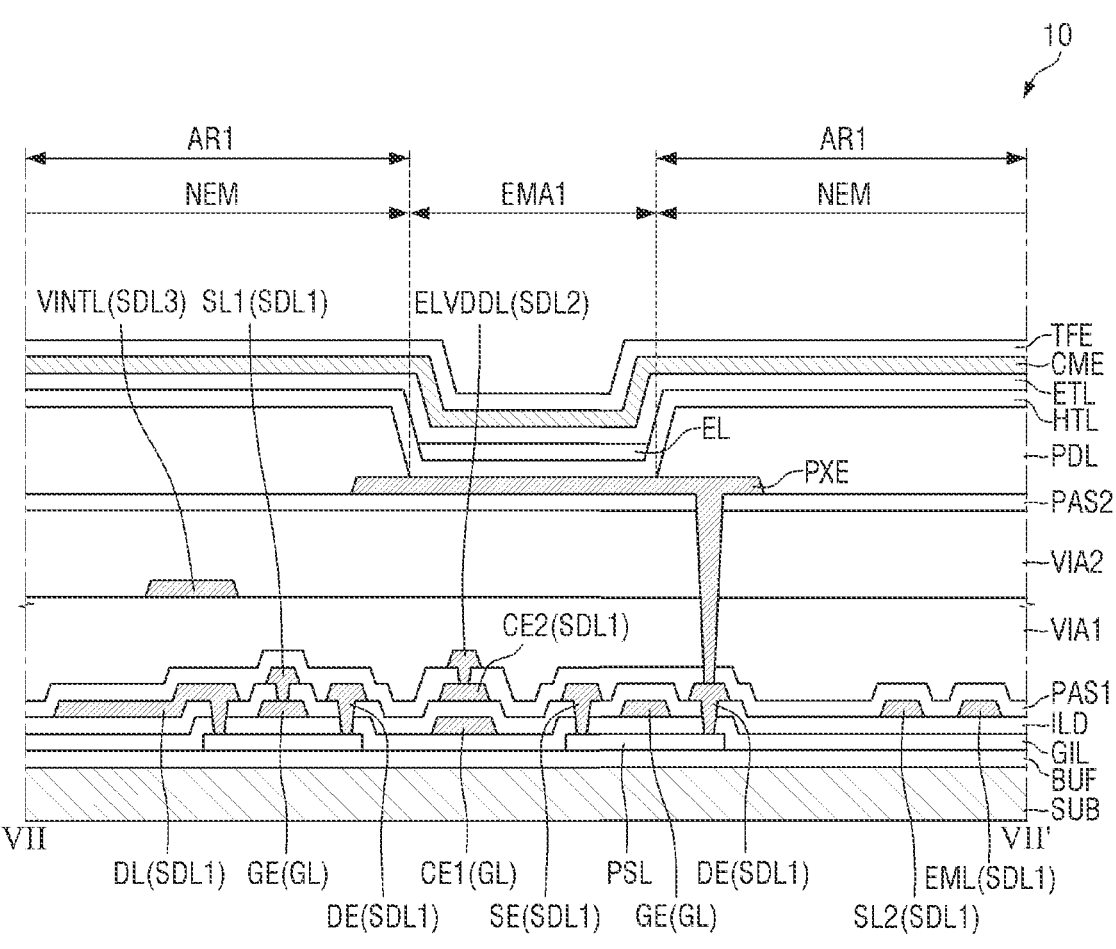
FIG. 7 is a cross-sectional view taken along the line VII-VII' of FIG. 4.

The storage capacitor Cst includes a first capacitor electrode CE1 (see FIG. 7) and a second capacitor electrode CE2 (see FIG. 7).

The plurality of transistors may include first to seventh transistors T1 to T7. Each transistor includes a gate electrode, a first source/drain electrode, and a second source/drain electrode. One of the first source/drain electrode and the second source/drain electrode becomes a source electrode, and the other becomes a drain electrode. Hereinafter, for simplicity of description, a first source/drain electrode will be abbreviated as a first electrode and a second source/drain electrode will be abbreviated as a second electrode.

Each of the transistors T1 to T7 may be a thin film transistor. The transistors T1 to T7 may each be one of a PMOS transistor and a NMOS transistor. All of the seven transistors may be of the same type of transistors, but some of the transistors may be PMOS transistors, and the other transistors may be NMOS transistors. The drawing illustrates a case where all seven transistors are made of PMOS transistors.

The first transistor T1 is a driving transistor, in which the gate electrode is connected to the first electrode of the storage capacitor Cst, the first electrode is connected to the first power voltage ELVDD terminal via the fifth transistor T5, and the second electrode is connected to the anode electrode of the organic light emitting diode OLED via the sixth transistor T6. The first transistor T1 receives the data signal DATA from the data line according to the switching operation of the second transistor T2 and supplies the driving current Id to the organic light emitting diode OLED.

The second transistor T2 is a data transfer transistor, in which the gate electrode is connected to the first scan signal GW terminal, the first electrode is connected to the data signal DATA terminal, and the second electrode is connected to the first electrode of the first transistor T1 and is connected to the first power voltage ELVDD terminal via the fifth transistor T5. The second transistor T2 is turned on according to the first scan signal GW and performs a switching operation of transmitting the data signal DATA to the first electrode of the first transistor T1.

The third transistor T3 is a compensation transistor, in which the gate electrode is connected to the first scan signal GW terminal, the first electrode is connected to the second electrode of the first transistor T1 and is connected to the anode electrode of the organic light emitting diode OLED via the sixth transistor T6, and the second electrode is connected to the first electrode of the storage capacitor Cst, the first electrode of the fourth transistor T4, and the gate electrode of the first transistor T1, together. The third transistor T3 is turned on, according to the first scan signal GW, to connect the gate electrode and the second electrode of the first transistor T1, whereby the first transistor T1 forms a diode connection. As a consequence, a voltage difference as much as the threshold voltage of the first transistor T1 occurs between the first electrode and the gate electrode of the first transistor T1, and a threshold voltage-compensated data signal DATA is supplied to the gate electrode of the first transistor T1 to compensate for the threshold voltage deviation of the first transistor T1.

The fourth transistor T4 is a first initialization transistor, in which the gate electrode is connected to the second scan signal GI terminal, the second electrode is connected to the initialization voltage VINT terminal, and the first electrode is connected to the first electrode of the storage capacitor Cst, the second electrode of the third transistor T3, and the gate electrode of the first transistor T1, together. The fourth transistor T4 is turned on according to the second scan signal GI to transfer the initial voltage VINT to the gate electrode of the first transistor T1 to carry out an operation of initializing the voltage of the gate electrode of the first transistor T1.

The fifth transistor T5 is a first emission control transistor, in which the gate electrode is connected to the emission control signal EM terminal, the first electrode is connected to the first power voltage ELVDD terminal, and the second electrode is connected to the first electrode of the first transistor T1 and the second electrode of the second transistor T2.

The sixth transistor T6 is a second emission control transistor, in which the gate electrode is connected to the emission control signal EM terminal, the first electrode is connected to the second electrode of the first transistor T1 and the first electrode of the third transistor T3, and the second electrode is connected to the anode electrode of the organic light emitting diode OLED.

The fifth transistor T5 and the sixth transistor T6 are simultaneously turned on in response to the emission control signal EM, so that the driving current Id flows through the organic light emitting diode OLED.

The seventh transistor T7 is a second initialization transistor, in which the gate electrode is connected to the second scan signal GI terminal, the first electrode is connected to the anode electrode of the organic light emitting diode OLED, and the second electrode is connected to the initialization voltage VINT terminal. The seventh transistor T7 is turned on according to the second scan signal GI to initialize the anode electrode of the organic light emitting diode OLED.

The second electrode of the storage capacitor Cst is connected to the first power voltage ELVDD terminal. The first electrode of the storage capacitor Cst is connected simultaneously to the gate electrode of the first transistor T1, the second electrode of the third transistor T3, and the first electrode of the fourth transistor T4. The cathode electrode of the organic light emitting diode OLED is connected to the second source voltage ELVSS terminal. The organic light emitting diode OLED receives the driving current Id from the first transistor T1 and emits light to display an image.

The illustrated pixel circuit structure may be variously modified. It may be modified and applied in various forms known in the art, for example, a 2T1C structure including two transistors of a first transistor and a second transistor, and one capacitor, or a 3T1C, 3T2C, or 6T1C structure.

FIG. 7 is a cross-sectional view taken along line VII-VII' of FIG. 4.

FIG. 7 illustrates a cross section of the first pixel PX1, and illustrates the cross section of the first transistor and the second transistor of the plurality of transistors of FIG. 6. It is obvious that the description of the first pixel PX1 may also be applied to the second pixel PX2 and the third pixel PX3. In FIG. 7, for simplicity of explanation, a second source/drain electrode DE of the first transistor is directly connected to the pixel electrode PXE without the sixth transistor. For simplicity of description, hereinafter, the first pixel PX1 is referred to as the pixel PX.

Referring to FIGS. 4 to 7, the display device 10 includes the substrate SUB. Because this has been described above, some redundant description may be omitted.

A buffer layer BUF is arranged on the substrate SUB. The buffer layer BUF may prevent or reduce diffusion of impurity ions, prevent or reduce penetration of moisture or external air, and perform a surface planarization function.

A semiconductor layer PSL is arranged on the buffer layer BUF. The semiconductor layer PSL forms a channel of a thin film transistor of the pixel PX. The semiconductor layer PSL may include polycrystalline silicon. However, embodiments according to the present disclosure are not limited thereto, and the semiconductor layer PSL may include monocrystalline silicon, low-temperature polycrystalline silicon, amorphous silicon, or an oxide semiconductor. The oxide semiconductor may include, for example, a binary compound (ABx), a ternary compound (ABxCy), or a quaternary compound (ABxCyDz) including indium (In), zinc (Zn), gallium (Ga), tin (Sn), titanium (Ti), aluminum (Al), hafnium (Hf), zirconium (Zr), magnesium (Mg) and the like.

A gate insulating layer GIL is arranged on the semiconductor layer PSL. A gate conductive layer GL is arranged on the gate insulating layer GIL. The gate conductive layer GL may include a gate electrode GE of the thin film transistor of the pixel PX and the first capacitor electrode CE1 of the storage capacitor. The gate conductive layer GL may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The gate conductive layer GL may be a single film or a multilayer film.

An interlayer insulating layer ILD is arranged on the gate conductive layer GL. A source/drain conductive layer SDL is arranged on the interlayer insulating layer ILD. The source/drain conductive layer SDL may include a plurality of conductive layers separated by an insulating layer. For example, the source/drain conductive layer SDL may include a first source/drain conductive layer SDL1, a second source/drain conductive layer SDL2, and a third source/drain conductive layer SDL3. A first passivation layer PAS1 may be arranged as an insulating layer between the first source/drain conductive layer SDL1 and the second source/drain conductive layer SDL2, and a first planarization layer VIA1 may be arranged as an insulating layer between the second source/drain conductive layer SDL2 and the third source/drain conductive layer SDL3. A second planarization layer VIA2 may be arranged on the third source/drain conductive layer SDL3, and a second passivation layer PAS2 may be arranged on the second planarization layer VIA2.

The source/drain conductive layer SDL may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The source/drain conductive layer SDL may be a single film or a multilayer film. For example, the source/drain conductive layer SDL may have a stacked structure of Ti/Al/Ti, Mo/Al/Mo, Mo/AlGe/Mo, or Ti/Cu.

Various wires and electrodes constituting the pixel circuit may be formed of the first to third source/drain conductive layers SDL1, SDL2, and SDL3.

For example, the first source/drain conductive layer SDL1 may include a data line DL, and a first source/drain electrode SE and the second source/drain electrode DE of the thin film transistor. Moreover, part of the first scan line SL1, the second scan line SL2, the emission signal control line EML, and the like may also be formed of the first source/drain conductive layer SDL1. The first scan line SL1, the second scan line SL2, and the emission signal control line EML may be electrically connected to the gate conductive layer GL therebelow through a contact hole penetrating the interlayer insulating layer ILD. Furthermore, the second capacitor electrode CE2 of the storage capacitor may also be formed of the first source/drain conductive layer SDL1. The second source/drain conductive layer SDL2 may include a first power voltage line ELVDDL, and the third source/drain conductive layer SDL3 may include the initialization power line VINTL.

The number of gate conductive layers GL and the source/drain conductive layers SDL, or wires included in each source/drain conductive layer SDL may be variously modified according to a layout or the like. For example, a separate gate conductive layer forming the second capacitor electrode CE2 of the storage capacitor may be further arranged between the gate conductive layer GL and the first source/drain conductive layer SDL1. In some cases, the gate conductive layer GL may be omitted, and a gate electrode, a scan line, the first capacitor electrode CE1 of a storage capacitor, and the like may be formed by the source/drain conductive layer SDL. An example layout of the source/drain conductive layer SDL will be described later.

The second passivation layer PAS2 is arranged on the third source/drain conductive layer SDL3. The pixel electrode PXE is arranged on the second passivation layer PAS2. The pixel electrode PXE may be electrically connected to the second source/drain electrode DE of the thin film transistor (first transistor). The pixel electrode PXE may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof. The material layer having a high work function may be arranged above the reflective material layer and arranged closer to an organic layer OL. The pixel electrode PXE may have a multilayer structure of ITO/Mg, ITO/$MgF_2$, ITO/Ag or ITO/Ag/ITO, but embodiments according to the present disclosure are not limited thereto.

The pixel defining layer PDL may be arranged on the pixel electrode PXE. The pixel defining layer PDL may include an opening exposing the pixel electrode PXE. The non-emission areas NEM and the emission areas EMA may be distinguished by the pixel defining layer PDL and the openings thereof. In other words, the area in which the opening penetrating the pixel defining layer PDL and exposing the pixel electrode PXE is arranged may be referred to as the emission area EMA, and the area in which the pixel defining layer PDL is arranged may be referred to as the non-emission area NEM.

The organic layer OL is arranged in the opening of the pixel defining layer PDL. The organic layer OL may be arranged on the pixel electrode PXE exposed by the opening of the pixel defining layer PDL. The organic layer OL may include a hole injection/transport layer HTL, a light emitting layer EL, and an electron injection/transport layer ETL that are sequentially stacked.

The hole injection/transport layer HTL may be arranged at the lowermost portion of the organic layer OL. The hole injection/transport layer HTL may play a role of smoothly transporting holes, and may play a role of smoothly injecting holes into the light emitting layer EL. Although the hole injection/transport layer HTL is illustrated as consisting of one layer, embodiments according to the present disclosure are not limited thereto, and the hole injection layer and the hole transport layer may be provided as two separate layers.

The light emitting layer EL may be arranged on the hole injection/transport layer HTL. The light emitting layer EL may be arranged between the hole injection/transport layer HTL and the electron injection/transport layer ETL. The light emitting layer EL may emit light by reaction between holes provided from the hole injection/transport layer HTL and electrons provided from the electron injection/transport layer ETL.

The electron injection/transport layer ETL may be arranged on the uppermost portion of the organic layer OL. The electron injection/transport layer ETL may play a role of smoothly transporting electrons, and may play a role of smoothly injecting electrons into the light emitting layer EL. Although the electron injection/transport layer ETL is illustrated as consisting of one layer, embodiments according to the present disclosure are not limited thereto, and the electron injection layer and the electron transport layer may be provided as two separate layers.

The light emitting layer EL may be arranged in each of the first to third emission areas EMA1, EMA2, and EMA3, and the hole injection/transport layer HTL and the electron injection/transport layer ETL may be arranged over the first to third emission areas EMA1, EMA2, and EMA3 arranged on each of the plurality of islands ISL. The hole injection/transport layer HTL and the electron injection/transport layer ETL may be arranged on the entire surface of each pixel PX. The hole injection/transport layer HTL and the electron injection/transport layer ETL may be arranged on the pixel defining layer PDL, and may be arranged over the plurality of islands ISL and the plurality of bridges BR. However, embodiments according to the present disclosure are not limited thereto, and at least one of the hole injection/transport layer HTL and the electron injection/transport layer ETL may be arranged for each of the first to third emission areas EMA1, EMA2, and EMA3.

The common electrode CME may be arranged on the organic layer OL. When the electron injection/transport layer ETL is arranged over the first to third emission areas EMA1, EMA2, and EMA3 arranged on each of the plurality of islands ISL, the common electrode CME may be arranged on the electron injection/transport layer ETL. That is, the common electrode CME may be arranged on the entire surface of each pixel PX.

The common electrode CME may be arranged over the plurality of islands ISL and the plurality of bridges BR. The common electrode CME may be arranged over a plurality of pixels PX. In an embodiment, the common electrode CME may be over the first area AR1 and the emission area EMA. When the electron injection/transport layer ETL is arranged over the first to third emission areas EMA1, EMA2, and EMA3 arranged on each of the plurality of islands ISL, the common electrode CME in a plan view may include substantially the same pattern as the electron injection/transport layer ETL. However, the area in which the common electrode CME is arranged is not limited thereto. In addition, the common electrode CME may be arranged on the side surface of each of the stacking members exposed by the cutout SLT. A detailed description of the arrangement of the common electrode CME will be described later.

The common electrode CME may include a material layer having a low work function, such as Li, Ca, LiF, Al, Mg, Ag, Pt, Pd, Ni, Au Nd, Ir, Cr, BaF, Ba or a compound or mixture thereof (e.g., a mixture of Ag and Mg), or a material with multilayer structure such as LiF/Ca or LiF/Al. The common electrode CME may further include a transparent metal oxide layer arranged on the material layer having a low work function.

An encapsulation layer TFE may be arranged on the common electrode CME. The encapsulation layer TFE may include an inorganic material, and the encapsulation layer TFE may encapsulate the common electrode CME, the organic layer OL, or the like, therebelow. The encapsulation layer TFE may have a plurality of stacked structures, and in this case, each stacked structure may include any one of an inorganic material and an organic material.

Each of the above-described buffer layer BUF, gate insulating layer GIL, interlayer insulating layer ILD, first passivation layer PAS1, and second passivation layer PAS2 may include an inorganic insulating material such as silicon oxide, silicon nitride, silicon oxynitride, hafnium oxide, aluminum oxide, titanium oxide, tantalum oxide, and zinc oxide ($ZnO_x$, $ZnO_x$ may be ZnO or $ZnO_2$).

The first planarization layer VIA1, the second planarization layer VIA2, and the pixel defining layer PDL may contain an organic insulating material such as acrylic resin (polyacrylate resin), epoxy resin, phenolic resin, polyamide resin, polyimide resin, unsaturated polyester resin, polyphenylene resin, polyphenylenesulfide resin and benzocyclobutene (BCB).

However, the material constituting the insulating layer is not limited to those illustrated above, and any suitable insulating materials may be applied as constituting materials of each insulating layer.

The display device 10 may further include a first area AR1 and a second area AR2 having different heights of the uppermost portions of the insulating layer. With respect to one surface or the other surface of the substrate SUB, the height of one surface of the insulating layer arranged in the uppermost portion among the insulating layers arranged in the first area AR1, may be located at a position higher than the height of one surface of the insulating layer arranged in the uppermost portion among the insulating layers arranged in the second area AR2. The first area AR1 and the second area AR2 may have different stacked structures.

The first area AR1 and the second area AR2 may be arranged outside the first to third emission areas EMA1, EMA2, and EMA3. The first area AR1 and the second area AR2 may not overlap the first to third emission areas EMA1, EMA2, and EMA3. The pixel defining layer PDL may be arranged in the first area AR1 so as not to expose the pixel electrode PXE and may not emit light. According to some embodiments, even if the pixel defining layer PDL is not arranged in the second area AR2, the pixel electrode PXE may not be exposed and light may not be emitted.

In a plan view, the first area AR1 may surround the first to third emission areas EMA1, EMA2, and EMA3. The entire area of the first area AR1 may be arranged in the non-emission area NEM while overlapping the non-emission area NEM. Although not limited to the following, in a plan view, the first area AR1 may include substantially the same pattern as the non-emission area NEM. The first area AR1 may include the plurality of islands ISL, and may include at least a part of each of the plurality of bridges BR. In other words, the first area AR1 may be arranged over the plurality of islands ISL and the plurality of bridges BR.

The first area AR1 may be arranged over the plurality of islands ISL and the plurality of bridges BR, and may be integrally formed in the entire area. In other words, the first area AR1 may be physically connected in the entire area. A plurality of second areas AR2 may be provided, and the plurality of second areas AR2 may be separated from each other and spaced apart from each other by the first area AR1. In a plan view, each of the plurality of second areas AR2 may be distinguished by the first area AR1 and the cutout SLT. In a plan view, the first area AR1 and the cutout SLT may surround each of the plurality of second areas AR2. In other words, in a plan view, the second area AR2 may be at least partially surrounded by the first area AR1, and the remaining area of the second area AR2 may be surrounded by the cutout SLT.

The second area AR2 may be arranged around the cutout SLT in a plan view. Each of the second areas AR2 may be arranged at (around) at least one of both ends of the cutout SLT in a plan view. The second area AR2 may be arranged at (around) at least one of both ends in the direction in which the cutout SLT extends in a plan view. In other words, in a plan view, the cutout SLT may have a larger width in any one direction of the first direction DR1 and the second direction DR2. The second area AR2 may be arranged around at least any side of one side and the other side of the direction, in which the cutout SLT has a larger width, of the first direction DR1 and the second direction DR2.

For example, when the width of the cutout SLT in the first direction DR1 is larger than the width of the cutout SLT in the second direction DR2 in a plan view, the second area AR2 may be arranged around one side and the other side of the cutout SLT in the first direction DR1. In addition, when the width of the cutout SLT in the second direction DR2 is larger than the width of the cutout SLT in the first direction DR1 in a plan view, the second area AR2 may be arranged around one side and the other side of the cutout SLT in the second direction DR2. In other words, a width in a first direction DR1 of a first group of the cutouts SLT is greater than a width in a second direction DR2 crossing the first direction DR1 thereof, and a width in the second direction DR2 of a remaining group of the cutouts SLT is greater than a width in the first direction DR1 thereof, wherein the second area is around one end and the other end of the first group of the cutouts SLT in the first direction DR1, and is around one end and the other end of the remaining group of the cutouts SLT in the second direction DR2.

When the width of the cutout SLT in the first direction DR1 is larger than the width of the cutout SLT in the second direction DR2 in a plan view, the width in the second direction DR2 of the second area AR2 arranged around one side and the other side of the first direction DR1 of the cutout SLT may be larger than the width in the second direction DR2 of the cutout SLT. For example, when the width of the cutout SLT in the first direction DR1 is larger than the width of the cutout SLT in the second direction DR2 in a plan view, one end of the second direction DR2 of the second area AR2 arranged around one side and the other side of the first direction DR1 of the cutout SLT may protrude further toward one side of the second direction DR2 than one end of the second direction DR2 of the cutout SLT, and the other end of the second direction DR2 of the second area AR2 arranged around one side and the other side of the first direction DR1 of the cutout SLT may protrude further toward the other side of the second direction DR2 than the other end of the second direction DR2 of the cutout SLT, but embodiments according to the present disclosure are not limited thereto.

When the width of the cutout SLT in the first direction DR1 is larger than the width of the cutout SLT in the second direction DR2 in a plan view, one end of the first direction DR1 of the second area AR2 arranged around one side of the first direction DR1 of the cutout SLT may be arranged further toward one side of the first direction DR1 than one end of the first direction DR1 of the cutout SLT, and the other end of the first direction DR1 of the second area AR2 arranged around one side of the first direction DR1 of the cutout SLT may be arranged further toward the other side of the first direction DR1 than the other end of the first direction DR1 of the cutout SLT.

At least a part of the second area AR2 may be arranged between the cutouts SLT extending in different directions. In other words, at least a part of the second area AR2 may be arranged between the cutout SLT in which the width in the first direction DR1 is larger than the width in the second direction DR2 in a plan view, and the cutout SLT in which the width in the second direction DR2 is larger than the width in the first direction DR1.

When the substrate SUB, the stacked structure arranged on the substrate SUB, and the like are not arranged in the cutout SLT, the first to third emission areas EMA1, EMA2, and EMA3, the first area AR1, and the second area AR2 may be substantially the same as the area in which the substrate SUB is arranged. That is, the first to third emission areas EMA1, EMA2, and EMA3, the first area AR1, and the second area AR2 may have substantially the same planar shape as the planar shape of the substrate SUB. However, embodiments according to the present disclosure are not limited thereto, and for example, when the substrate SUB is removed from the cutout SLT, but an insulating layer or the like is arranged, at least one of the first area AR1 and the second area AR2 may overlap the cutout SLT.

As the heights of the uppermost portions of the insulating layers arranged in each of the first area AR1 and the second area AR2 are different, the common electrode CME arranged in the first area AR1 and a second dummy pattern DM2 (see FIG. 8) arranged in the second area AR2 may be physically separated. In this case, although the common electrode CME is arranged over the plurality of islands ISL and the bridge BR and the display device 10 is stretched and contracted, it is possible to suppress or prevent or reduce the propagation of cracks or the like that may occur in the second dummy pattern DM2 (see FIG. 8), to the common electrode CME.

This will be described in detail with further reference to FIG. 8.

Figure 8:
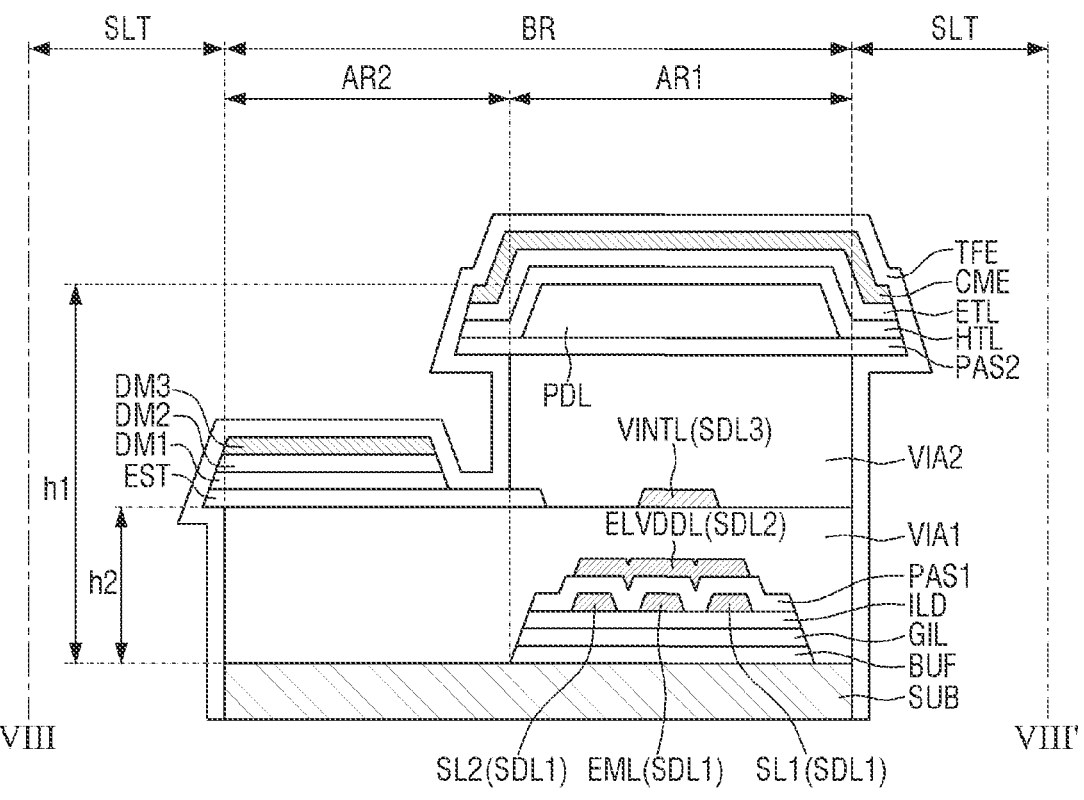
FIG. 8 is a cross-sectional view taken along the line VIII-VIII' of FIG. 4.

FIG. 8 is a cross-sectional view taken along line VIII-VIII' of FIG. 4.

FIG. 8 illustrates a stacked structure of the display device 10 (see FIG. 1). Descriptions of each of the stacked structures and the stacking order of the stacked structures illustrated in FIG. 8 may be substantially the same as those described with reference to FIG. 7. Accordingly, the same contents are omitted or simplified, and the differences will be described in detail.

Referring to FIGS. 4 and 8, the heights of the uppermost portions of the insulating layers arranged in the first area AR1 and the second area AR2 may be different from each other with respect to one surface or the other surface of the substrate SUB. With respect to one surface or the other surface of the substrate SUB, the height of the uppermost portion of the insulating layer arranged in the first area AR1 may be located at a position higher than the height of the uppermost portion of the insulating layer arranged in the second area AR2.

For example, the height of the uppermost portion of the insulating layer arranged in the first area AR1 may be referred to as the height of one surface of the pixel defining layer PDL, and the height of the uppermost portion of the insulating layer arranged in the second area AR2 may be referred to as the height of one surface of the first planarization layer VIA1. In this case, one surface of the pixel defining layer PDL may be located at a first height h1 with respect to one surface of the substrate SUB in the first area AR1, and one surface of the first planarization layer VIA1 may be located at a second height h2 with respect to one surface of the substrate SUB in the second area AR2. The first height h1 may be located at a position higher than the second height h2 with respect to one surface of the substrate SUB.

The first area AR1 and the second area AR2 may have different stacked structures. First, the stacked structure of the first area AR1 will be described.

The first area AR1 may be provided with the substrate SUB, and, sequentially on the substrate SUB, the buffer layer BUF, the gate insulating layer GIL, the interlayer insulating layer ILD, the first source/drain conductive layer SDL1, the first passivation layer PAS1, the second source/drain conductive layer SDL2, the first planarization layer VIA1, the third source/drain conductive layer SDL3, the second planarization layer VIA2, the second passivation layer PAS2, the pixel defining layer PDL, the hole injection/ transport layer HTL, the electron injection/transport layer ETL, the common electrode CME, and the encapsulation layer TFE.

The first source/drain conductive layer SDL1 may include the first scan line SL1, the second scan line SL2, and the emission signal control line EML, the second source/drain conductive layer SDL2 may include the first power voltage line ELVDDL, and the third source/drain conductive layer SDL3 may include the initialization power line VINTL. In other words, the first scan line SL1, the second scan line SL2, the emission signal control line EML, the first power voltage line ELVDDL, and the initialization power line VINTL may be arranged and extended in the first area AR1 of the bridge BR.

Figure 9:
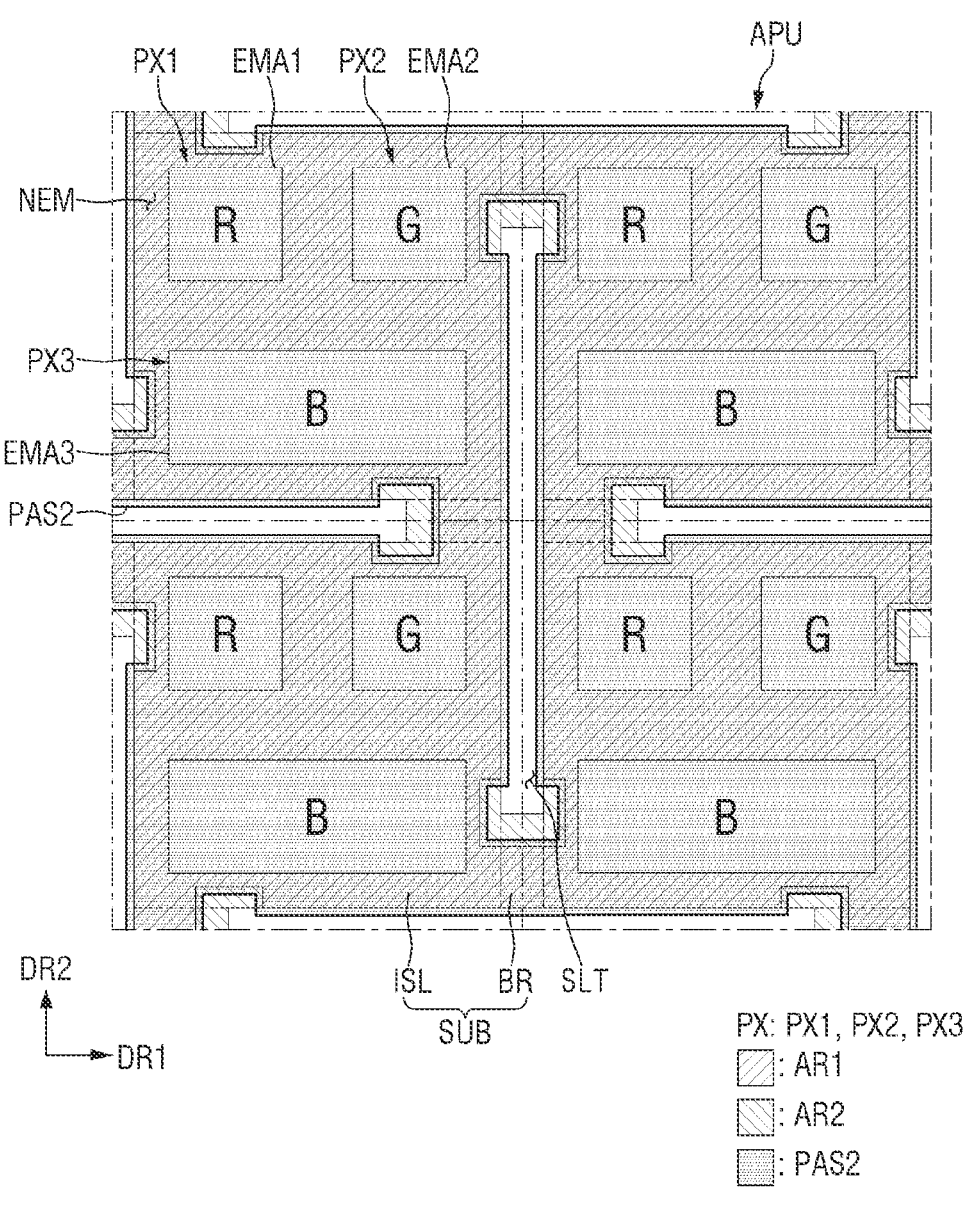
FIG. 9 is a schematic diagram illustrating an arrangement of a substrate and a second passivation layer of a display device according to some embodiments.

The second passivation layer PAS2 may protrude toward at least one of the second area AR2 and the cutout SLT from the first area AR1 in a plan view. FIG. 9 is further referred to describe the arrangement of the second passivation layer PAS2 in a plan view.

FIG. 9 is a schematic diagram illustrating an arrangement of a substrate and a second passivation layer of a display device according to some embodiments.

Referring to FIG. 9 further, in a plan view, the second passivation layer PAS2 may protrude from the first area AR1 to the adjacent second area AR2, or may protrude from the first area AR1 to the adjacent cutout SLT. The side surface of the second passivation layer PAS2 may be arranged outside the side surface of the second planarization layer VIA2. The side surface of the second passivation layer PAS2 may protrude outward from the side surface of the second planarization layer VIA2. Accordingly, the second passivation layer PAS2 may have a tip shape (or eave shape) near the edge.

As the second passivation layer PAS2 has a tip shape, the second passivation layer PAS2 may be directly in contact with the encapsulation layer TFE. In other words, the hole injection/transport layer HTL, the electron injection/transport layer ETL, and the common electrode CME may not be arranged on the side surface and the other surface (bottom surface) of the second passivation layer PAS2 protruding outward, and the encapsulation layer TFE may be arranged on the side surface and the other surface (bottom surface) of the second passivation layer PAS2 protruding outward. Accordingly, the second passivation layer PAS2 may be directly in contact with the encapsulation layer TFE, and encapsulation by the encapsulation layer TFE may be smoother and more robust.

However, embodiments according to the present disclosure are not limited thereto, and at least one of the hole injection/transport layer HTL, the electron injection/transport layer ETL, and the common electrode CME may be arranged on the side surface of the second passivation layer PAS2. In this case, the encapsulation layer TFE may be arranged on the other surface (bottom surface), which protrudes outward from the second passivation layer PAS2, of the second passivation layer PAS2. Accordingly, the second passivation layer PAS2 may be directly in contact with the encapsulation layer TFE.

Referring to FIGS. 4 and 8 again, the common electrode CME may be arranged in the first area AR1 as well as the first to third emission areas EMA1, EMA2, and EMA3 of each island ISL. The common electrode CME may include substantially the same pattern as the second passivation layer PAS2 in a plan view.

The common electrode CME may be arranged over the plurality of islands ISL and the plurality of bridges BR, and may be provided integrally. The common electrode CME may be arranged over the entire area of the plurality of islands ISL and the plurality of bridges BR. In other words, the common electrode CME may be arranged over the entire area of the plurality of pixels PX. Accordingly, a contact hole for contact between the separate second power voltage line that transmits the second power voltage ELVSS (see FIG. 6) to the common electrode CME, and the common electrode CME may be unnecessary and thus omitted, or although not omitted, may not be arranged on the island ISL and the bridge BR. Accordingly, the opening ratio of the first to third emission areas EMA1, EMA2, and EMA3 of the pixels PX1, PX2, and PX3 arranged on each island ISL may be improved, and the resolution of the display device 10 (see FIG. 1) may be improved. Furthermore, a high-resolution display device 10 (see FIG. 1) may be implemented.

According to some embodiments, the number of pixels PX per unit area (pixels per inch, ppi) of the display device 10 (see FIG. 1) may be in the range of 200 to 500 or in the range of 250 to 300.

The encapsulation layer TFE may be arranged on the common electrode CME. The encapsulation layer TFE may include high step coverage. The encapsulation layer TFE may be arranged along the exposed surface of each stacked structure regardless of the tip of the second passivation layer PAS2. In other words, the encapsulation layer TFE may be arranged along the top surface and side surface of the common electrode CME, the side surface of the electron injection/transport layer ETL, the side surface of the hole injection/transport layer HTL, the side surface and the other surface (bottom surface) of the second passivation layer PAS2, and the side surface of the second planarization layer VIA2. Further, as will be described later, the encapsulation layer TFE may be arranged in the second area AR2, along the top surface and side surface of a third dummy pattern DM3, the side surface of the second dummy pattern DM2, the side surface of the first dummy pattern DM1, and the top surface, side surface, and bottom surface of an etch stop pattern EST.

Next, the stacked structure of the second area AR2 will be described.

The display device 10 may further include the etch stop pattern EST, the first dummy pattern DM1, the second dummy pattern DM2, and the third dummy pattern DM3 (or a dummy conductive pattern). The etch stop pattern EST, the first dummy pattern DM1, the second dummy pattern DM2, and the third dummy pattern DM3 may be arranged in the second area AR2.

The substrate SUB, the first planarization layer VIA1, the etch stop pattern EST, the first dummy pattern DM1, the second dummy pattern DM2, and the third dummy pattern DM3 may be arranged in the second area AR2. That is, the first planarization layer VIA1 may be arranged over the first area AR1 and the second area AR2.

The etch stop pattern EST may be arranged on the substrate SUB. The etch stop pattern EST may include an inorganic insulating material. The etch stop pattern EST may partially protrude from the second area AR2 to the first area AR1, but embodiments according to the present disclosure are not limited thereto. The etch stop pattern EST may play a role of an etch stopper in the process of patterning the second planarization layer VIA2. In other words, the etch stop pattern EST may play a role of preventing or reducing the first planarization layer VIA1 arranged in the second area AR2 from being etched in the process of patterning the second planarization layer VIA2 by etching the second planarization layer VIA2 arranged in the second area AR2.

The etch stop pattern EST may have a tip shape. The tip of the etch stop pattern EST may protrude toward the cutout SLT from the second area AR2 in a plan view. The side surface of the etch stop pattern EST may be arranged outside the side surface of the first planarization layer VIA1. The side surface of the etch stop pattern EST may protrude outward from the side surface of the first planarization layer VIA1.

As the etch stop pattern EST includes a tip shape, the etch stop pattern EST may be directly in contact with the encapsulation layer TFE. In other words, the first dummy pattern DM1, the second dummy pattern DM2, and the third dummy pattern DM3 may not be arranged on the side surface and the other surface (bottom surface) of the etch stop pattern EST protruding outward, and the encapsulation layer TFE may be arranged on the side surface and the other surface (bottom surface) of the etch stop pattern EST protruding outward. Accordingly, the etch stop pattern EST may be directly in contact with the encapsulation layer TFE, and encapsulation by the encapsulation layer TFE may be smoother and more robust.

However, embodiments according to the present disclosure are not limited thereto, and at least one of the first dummy pattern DM1, the second dummy pattern DM2, and the third dummy pattern DM3 may be arranged on the side surface of the etch stop pattern EST. In this case, the encapsulation layer TFE may be arranged on the other surface (bottom surface) of the etch stop pattern EST protruding to the outside of the etch stop pattern EST. Accordingly, the etch stop pattern EST may be directly in contact with the encapsulation layer TFE.

The first dummy pattern DM1 may be arranged on the etch stop pattern EST. The first dummy pattern DM1 may be located at a lower height than the hole injection/transport layer HTL with respect to one surface or the other surface of the substrate SUB. The first dummy pattern DM1 may include substantially the same material as the hole injection/transport layer HTL. The first dummy pattern DM1 may be physically separated from and spaced apart from the hole injection/transport layer HTL. The first dummy pattern DM1 may have an island shape in a plan view. The first dummy pattern DM1 may be arranged on a layer different from the hole injection/transport layer HTL. The first dummy pattern DM1 may be arranged directly on the etch stop pattern EST, and the hole injection/transport layer HTL may be arranged directly on the pixel defining layer PDL.

The first dummy pattern DM1 may be formed together with the hole injection/transport layer HTL. In other words, the hole injection/transport layer HTL and the first dummy pattern DM1 may be deposited through one mother substrate. Through one mother substrate, the material for the hole injection/transport layer may be deposited over the first area AR1 and the second area AR2, and the material layer for the hole injection/transport layer deposited in the first area AR1 may be the hole injection/transport layer HTL, and the material layer for the hole injection/transport layer deposited in the second area AR2 may be the first dummy pattern DM1.

The material layer for the hole injection/transport layer (or the hole injection/transport layer HTL) deposited in the first area AR1, and the material layer for the hole injection/transport layer (or the first dummy pattern DM1) deposited in the second area AR2 may be physically disconnected from each other by the tip of the second passivation layer PAS2 although formed through one mother substrate. The material for the hole injection/transport layer may have relatively low step coverage, and thus, may not be deposited in an area covered by the tip of the second passivation layer PAS2. In other words, the material for the electron injection/transport layer may not be deposited on the second area AR2 overlapping the tip of the second passivation layer PAS2, the side surface of the second planarization layer VIA2 overlapping the tip of the second passivation layer PAS2, and the other surface (bottom surface) of the tip of the second passivation layer PAS2. Accordingly, the hole injection/transport layer HTL arranged in the first area AR1 and the first dummy pattern DM1 arranged in the second area AR2 may be physically separated from each other.

The second dummy pattern DM2 may be arranged on the first dummy pattern DM1. The second dummy pattern DM2 may be located at a lower height than the electron injection/transport layer ETL with respect to one surface or the other surface of the substrate SUB. The second dummy pattern DM2 may include substantially the same material as the electron injection/transport layer ETL. The second dummy pattern DM2 may be physically separated from and spaced apart from the electron injection/transport layer ETL. The second dummy pattern DM2 may have an island shape in a plan view. The second dummy pattern DM2 may be arranged on a layer different from the electron injection/transport layer ETL. The second dummy pattern DM2 may be arranged directly on the first dummy pattern DM1, and the electron injection/transport layer ETL may be arranged directly on the hole injection/transport layer HTL.

The second dummy pattern DM2 may be formed together with the electron injection/transport layer ETL. In other words, the electron injection/transport layer ETL and the second dummy pattern DM2 may be deposited through one mother substrate. Through one mother substrate, the material for the electron injection/transport layer may be deposited over the first area AR1 and the second area AR2, and the material layer for the electron injection/transport layer deposited in the first area AR1 may be the electron injection/transport layer ETL, and the material layer for the electron injection/transport layer deposited in the second area AR2 may be the second dummy pattern DM2.

The material layer for the electron injection/transport layer (or the electron injection/transport layer ETL) deposited in the first area AR1, and the material layer for the electron injection/transport layer (or the second dummy pattern DM2) deposited in the second area AR2 may be physically disconnected from each other by the tip of the second passivation layer PAS2 although formed through one mother substrate. The material for the electron injection/transport layer may have relatively low step coverage, and thus, may not be deposited in an area covered by the tip of the second passivation layer PAS2. In other words, the material for the electron injection/transport layer may not be deposited on the second area AR2 overlapping the tip of the second passivation layer PAS2, the side surface of the second planarization layer VIA2 overlapping the tip of the second passivation layer PAS2, and the other surface (bottom surface) of the tip of the second passivation layer PAS2. Accordingly, the electron injection/transport layer ETL arranged in the first area AR1 and the second dummy pattern DM2 arranged in the second area AR2 may be physically separated from each other.

The third dummy pattern DM3 may be arranged on the second dummy pattern DM2. The third dummy pattern DM3 may be located at a lower height than the common electrode CME with respect to one surface or the other surface of the substrate SUB. The third dummy pattern DM3 may include substantially the same material as the common electrode CME. The third dummy pattern DM3 may be physically separated from and spaced apart from the common electrode CME. The third dummy pattern DM3 may have an island shape in a plan view. The third dummy pattern DM3 may be arranged on a different layer from the common electrode CME. The third dummy pattern DM3 may be arranged directly on the second dummy pattern DM2, and the common electrode CME may be arranged directly on the electron injection/transport layer ETL.

The third dummy pattern DM3 may be formed together with the common electrode CME. In other words, the common electrode CME and the third dummy pattern DM3 may be deposited through one mother substrate. Through one mother substrate, the material for the common electrode may be deposited over the first area AR1 and the second area AR2, and the material layer for the common electrode deposited in the first area AR1 may be the common electrode CME, and the material layer for the common electrode deposited in the second area AR2 may be the third dummy pattern DM3.

The material layer for the common electrode (or the common electrode CME) deposited in the first area AR1, and the material layer for the common electrode (or the third dummy pattern DM3) deposited in the second area AR2 may be physically disconnected from each other by the tip of the second passivation layer PAS2 although formed through one mother substrate. The material for the common electrode may have relatively low step coverage, and thus, may not be deposited in an area covered by the tip of the second passivation layer PAS2. In other words, the material for the common electrode may not be deposited on the second area AR2 overlapping the tip of the second passivation layer PAS2, the side surface of the second planarization layer VIA2 overlapping the tip of the second passivation layer PAS2, and the other surface (bottom surface) of the tip of the second passivation layer PAS2. Accordingly, the common electrode CME arranged in the first area AR1 and the third dummy pattern DM3 arranged in the second area AR2 may be physically separated from each other, and the common electrode CME and the third dummy pattern DM3 may be electrically insulated.

The common electrode CME and the third dummy pattern DM3 are physically separated from each other, and thus although the common electrode CME is arranged over the entire area of the plurality of islands ISL and the plurality of bridges BR, defects such as cracks that may occur in the common electrode CME may be suppressed or prevented. In other words, when the common electrode CME is arranged over the entire area of the plurality of islands ISL and the plurality of bridges BR, and the display device 10 (see FIG. 1) or the substrate SUB is stretched and contracted, a larger strain may be applied toward both ends of the cutout SLT. For example, when the width of the cutout SLT in the first direction DR1 is larger than the width of the cutout SLT in the second direction DR2, as the third dummy pattern DM3 is closer to one side and the other side of the first direction DR1 of the cutout SLT, the strain applied to the display device 10 (see FIG. 1) or the substrate SUB due to stretching and contraction may increase.

However, the second area AR2 is arranged at both ends of the cutout SLT and the common electrode CME and the third dummy pattern DM3 are physically separated, and thus although a relatively large strain is applied to the third dummy pattern DM3 due to stretching and contraction of the display device 10 (see FIG. 1) or the substrate SUB, defects such as cracks that may occur in the third dummy pattern DM3 may be suppressed or prevented from propagating to the common electrode CME. Accordingly, the opening ratio of the first to third emission areas EMA1, EMA2, and EMA3 arranged on each island ISL may be improved while defects such as cracks that may occur in the common electrode CME may be suppressed or prevented, and thus the reliability of the display device 10 (see FIG. 1) may be improved.

In addition, descriptions of the common electrode CME and the third dummy pattern DM3 may be applied in substantially the same manner to the hole injection/transport layer HTL and the first dummy pattern DM1, and the electron injection/transport layer ETL and the second dummy pattern DM2. Some redundant description thereof may be omitted.

The encapsulation layer TFE may be arranged on the third dummy pattern DM3. The encapsulation layer TFE may be arranged over the first area AR1 and the second area AR2. The encapsulation layer TFE may be arranged not only on the island ISL and the bridge BR of the substrate SUB, but may also be arranged in the cutout SLT. The encapsulation layer TFE may be arranged on the side surfaces of the island ISL and bridge BR of the substrate SUB, the buffer layer BUF, the gate insulating layer GIL, the interlayer insulating layer ILD, the first passivation layer PAS1, the first planarization layer VIA1, the second planarization layer VIA2, the second passivation layer PAS2, the hole injection/transport layer HTL, the electron injection/transport layer ETL, and the common electrode CME, which are exposed by the cutout SLT, and may cover each side surface. Accordingly, it is possible to suppress or prevent the penetration of outside air and moisture through the cutout SLT.

Hereinafter, other embodiments will be described. In the following embodiments, a description of the same components as those of the above-described embodiments will be omitted or simplified, and differences will be mainly described.

Figure 10:
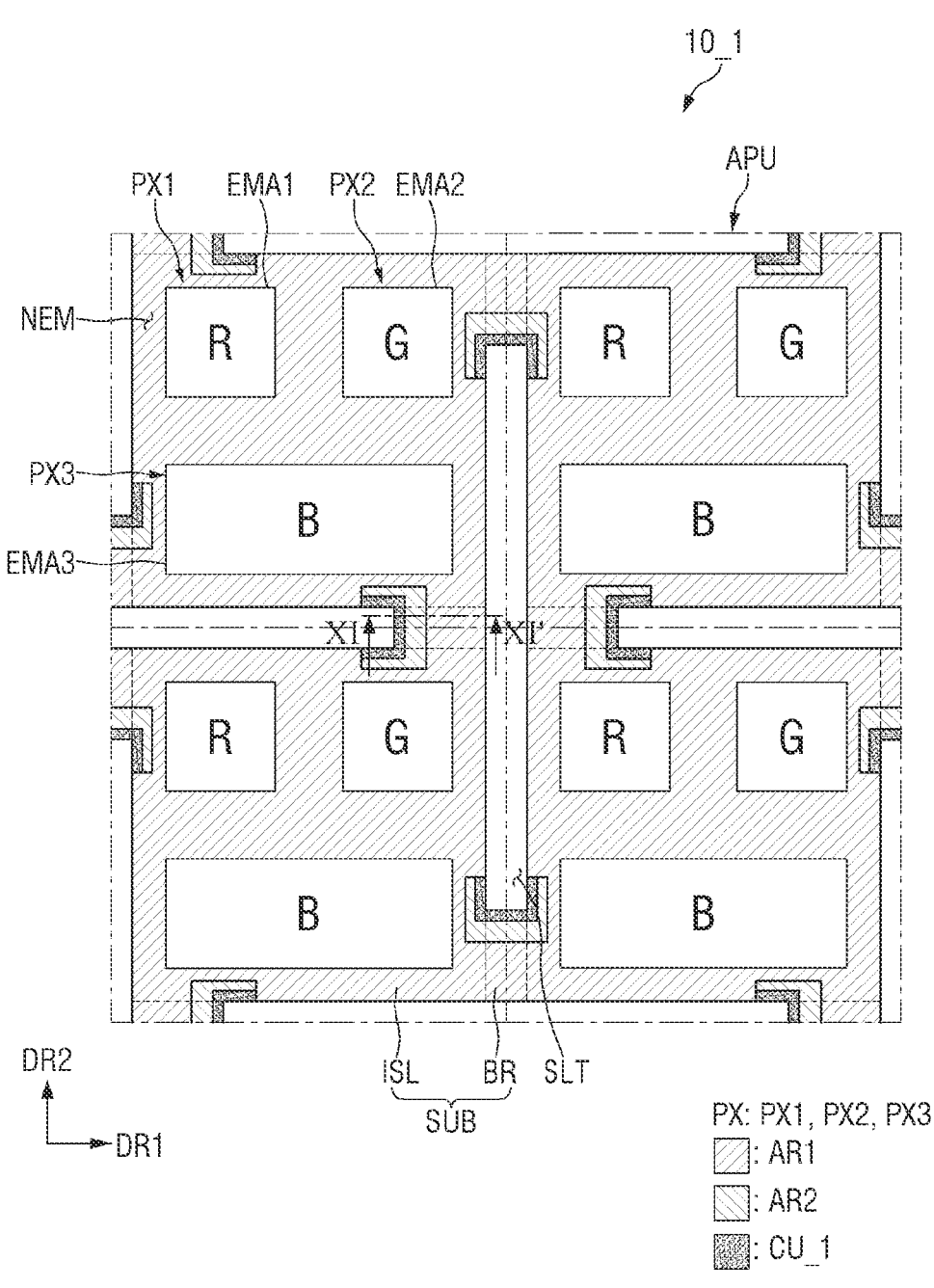
FIG. 10 is a schematic diagram illustrating an arrangement of a substrate island in a partial area of a display device according to some embodiments.
Figure 11:
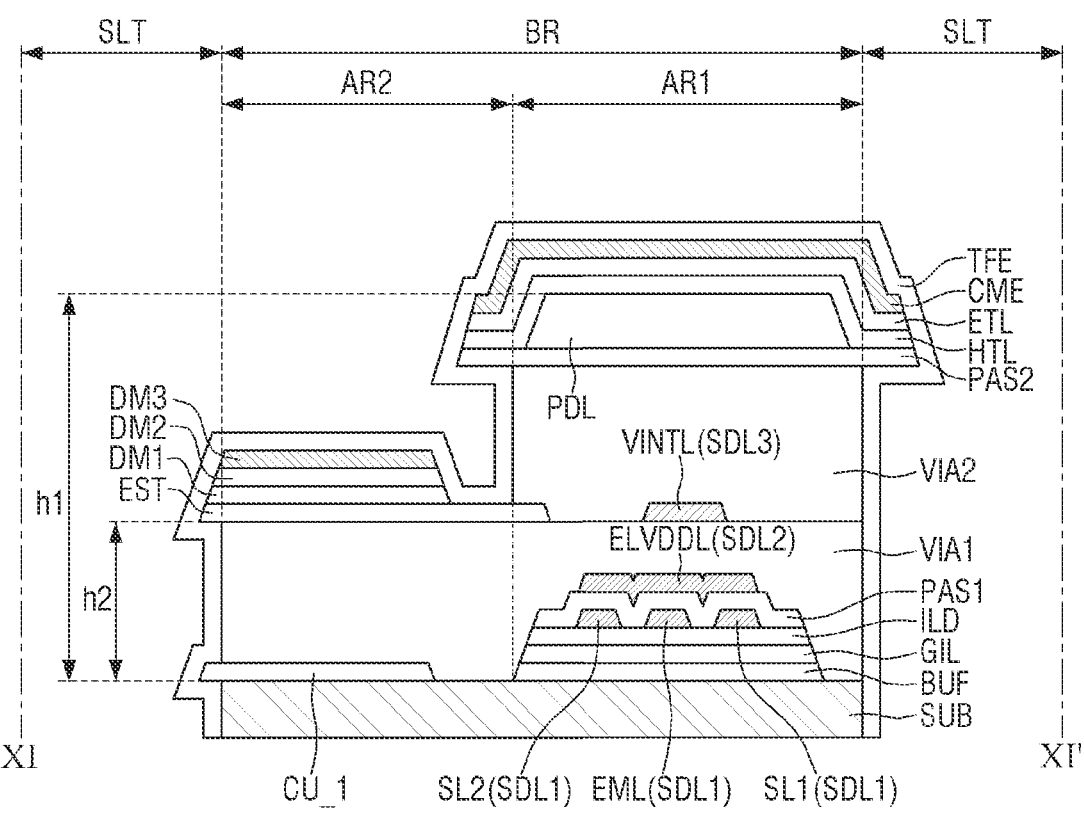
FIG. 11 is a cross-sectional view taken along the line XI-XI' of FIG. 10.

FIG. 10 is a schematic diagram illustrating an arrangement of a substrate island in a partial area of a display device according to some embodiments. FIG. 11 is a cross-sectional view taken along the line XI-XI' of FIG. 10.

Referring to FIGS. 10 and 11, a display device 10_1 is different from the embodiments described with respect to FIG. 4 in that it may further include an impact absorption pattern CU_1 arranged in the second area AR2. The impact absorption pattern CU_1 may include an inorganic material.

Specifically, the impact absorption pattern CU_1 may be arranged in the second area AR2. The impact absorption pattern CU_1 may be arranged on the substrate SUB, and may be arranged between the substrate SUB and the first planarization layer VIA1. The impact absorption pattern CU_1 may have an island shape in a plan view. The impact absorption pattern CU_1 may be physically separated from the inorganic insulating layer arranged in the first area AR1. In a plan view, the impact absorption pattern CU_1 may protrude from the second area AR2 toward the cutout SLT to include a tip shape.

The impact absorption pattern CU_1 may include an inorganic material and be arranged in the second area AR2 to absorb strain applied by stretching and contracting of the display device 10_1. Accordingly, the impact absorption pattern CU_1 may include cracks or the like. Although the impact absorption pattern CU_1 includes cracks or the like, the impact absorption pattern CU_1 may be physically spaced apart from the inorganic insulating layer of the first area AR1, and thus may not propagate defects such as cracks to the inorganic insulating layer.

In addition, when the substrate SUB includes a plurality of stacked structures, the impact absorption pattern CU_1 may be arranged between each stacked structure of the substrate SUB.

Even in this case, the opening ratio of the first to third emission areas EMA1, EMA2, and EMA3 may be improved, so that the resolution of the display device 10_1 may be improved, and defects such as cracks that may occur in the third dummy pattern DM3 may be suppressed or prevented from being propagated to the common electrode CME, so that defects such as cracks that may occur in the common electrode CME may be suppressed or prevented. In addition, as the impact absorption pattern CU_1 is further included, transmission of the strain applied by the stretching and contraction of the display device 10_1 may be more suppressed or prevented.

Figure 12:
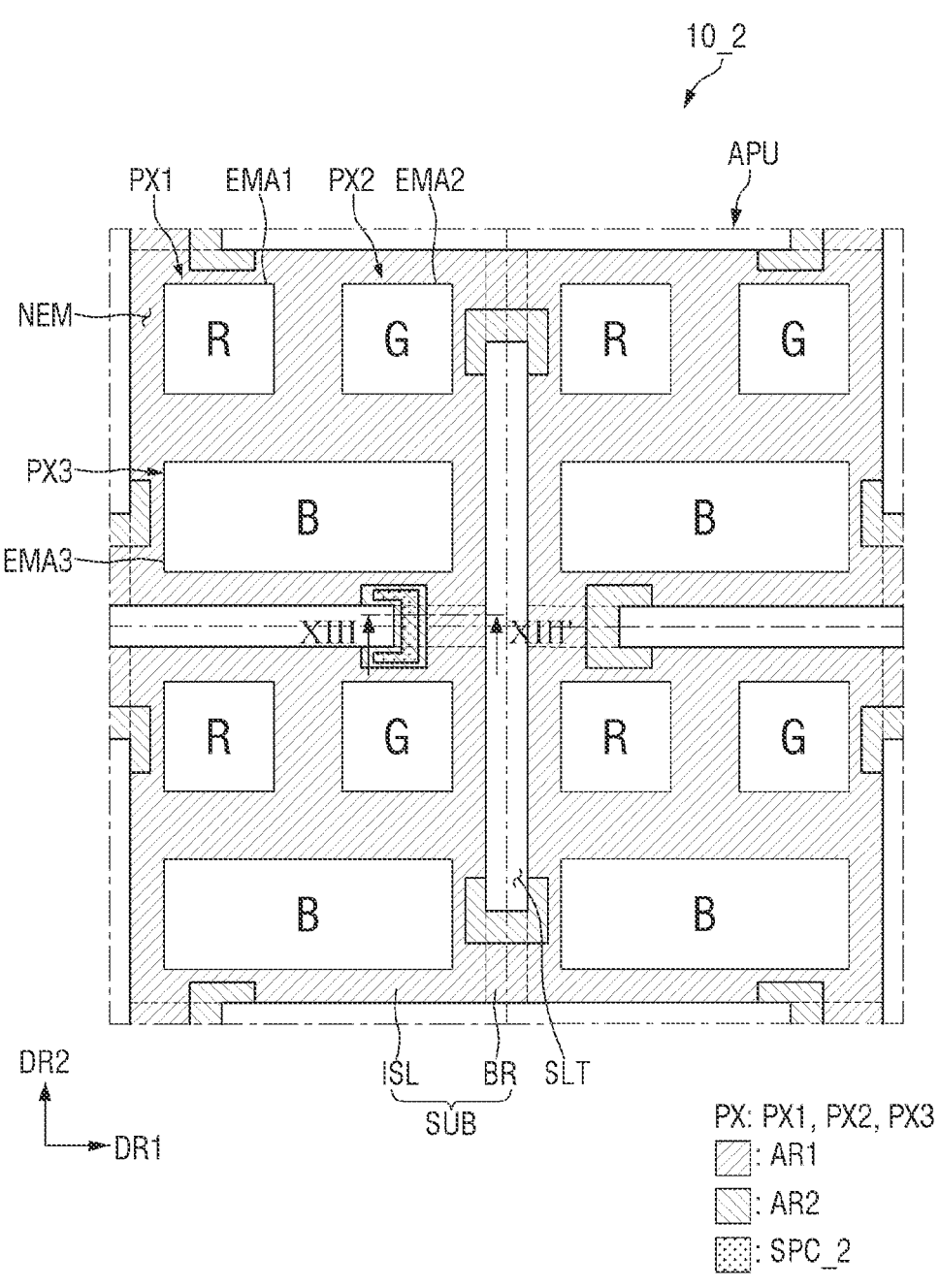
FIG. 12 is a schematic diagram illustrating an arrangement of a substrate island in a partial area of a display device according to some embodiments.
Figure 13:
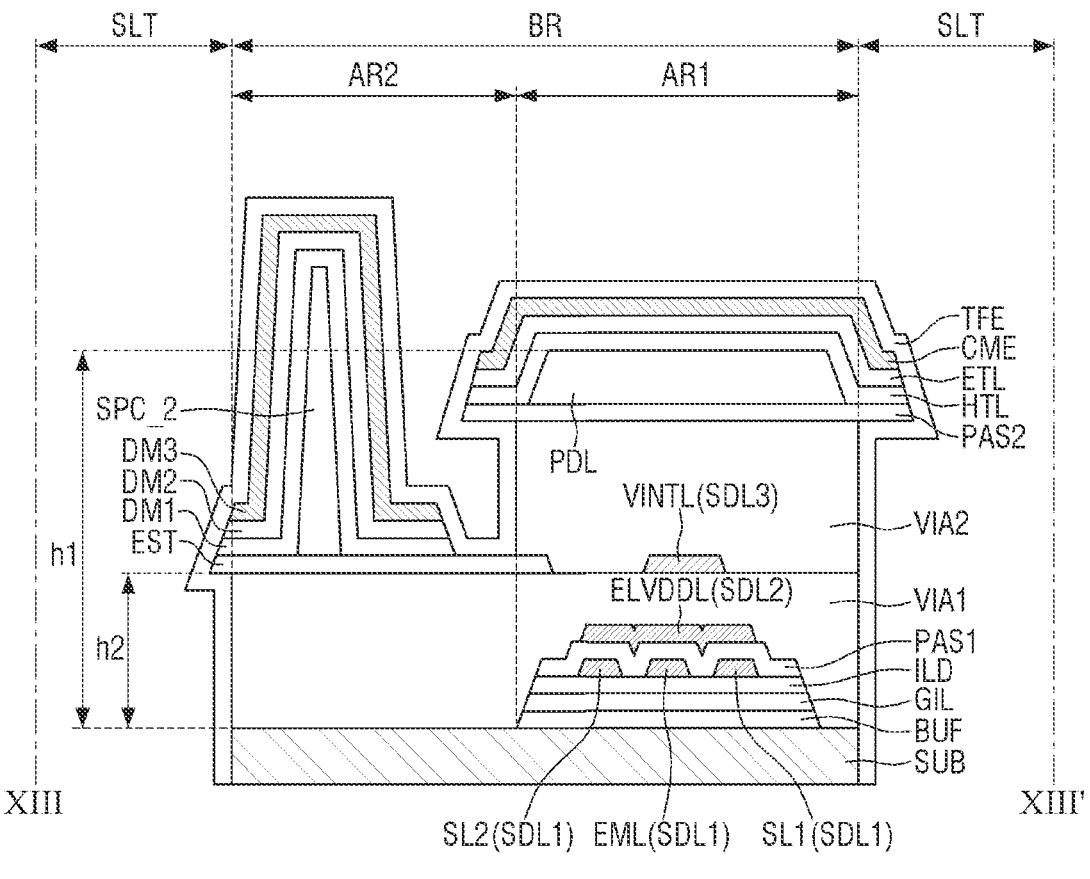
FIG. 13 is a cross-sectional view taken along the line XIII-XIII' of FIG. 12.

FIG. 12 is a schematic diagram illustrating an arrangement of a substrate island in a partial area of a display device according to some embodiments. FIG. 13 is a cross-sectional view taken along the line XIII-XIII' of FIG. 12.

Referring to FIGS. 12 and 13, a display device 10_2 is different from the embodiments described with respect to FIG. 4 in that it may further include a spacer SPC_2 arranged in the second area AR2. The spacer SPC_2 may be arranged on the etch stop pattern EST. The first dummy pattern DM1, the second dummy pattern DM2, the third dummy pattern DM3, and the encapsulation layer TFE may be arranged on the spacer SPC_2. The height of one surface of the spacer SPC_2 may be located at a position higher than the height of the one surface of the pixel defining layer PDL. The spacer SPC_2 may play a role of maintaining a distance to a fine metal mask (FMM) or the like. As the spacer SPC_2 is arranged in the second area AR2, a separate space for disposing the spacer SPC_2 is unnecessary, so that a decrease in the opening ratio of the emission areas EMA1, EMA2, and EMA3 due to the spacer SPC_2 may not be accompanied.

Even in this case, the opening ratio of the first to third emission areas EMA1, EMA2, and EMA3 may be improved, so that the resolution of the display device 10_2 may be improved, and defects such as cracks that may occur in the third dummy pattern DM3 may be suppressed or prevented from being propagated to the common electrode CME, so that defects such as cracks that may occur in the common electrode CME may be suppressed or prevented. In addition, as the spacer SPC_2 is further arranged, it may be possible to suppress or prevent imprinting defects due to the FMM or the like.

In concluding the detailed description, those skilled in the art will appreciate that many variations and modifications can be made to the example embodiments without substantially departing from the principles of embodiments according to the present disclosure, as defined in the appended claims and their equivalents. Therefore, the disclosed example embodiments of the invention are used in a generic and descriptive sense only and not for purposes of limitation.

What is claimed is:

1. A display device including a first area and a plurality of second areas spaced apart from each other by the first area, the display device comprising:

a substrate including a plurality of islands distinguished by a plurality of cutouts, and a plurality of bridges respectively adjacent to the plurality of islands;

a common electrode on a surface of the substrate in the first area;

a dummy conductive pattern on the substrate in a second area from among the plurality of second areas, physically separated from the common electrode, and including a same material as the common electrode, wherein the plurality of islands and the plurality of bridges are located at the first area, and each of the plurality of second areas is around at least one of both ends of a corresponding cutout from among the plurality of cutouts;

a first planarization layer between the substrate and the common electrode in the first area; and a first passivation layer on the first planarization layer, wherein the common electrode is on the first passivation layer, a first side surface of the first passivation layer protrudes outward from a first side surface of the first planarization layer over the second area from among the second areas, a second side surface of the first passivation layer opposite to the first side surface of the first passivation layer protrudes outward from a second side surface of the first planarization layer opposite to the first side surface of the first planarization layer, the first side surface of the first planarization layer and the second side surface of the first planarization layer do not directly contact the first passivation layer; and the second side surface of the first planarization layer does not overlap the substrate in a direction perpendicular to the surface of the substrate.

2. The display device of claim 1, wherein the common electrode is at a position higher than the dummy conductive pattern with respect to one surface or other surface of the substrate.

3. The display device of claim 2, wherein the common electrode and the dummy conductive pattern are electrically insulated.

4. The display device of claim 1, further comprising an emission area on each of the plurality of islands and configured to emit light, wherein the emission area is surrounded by the first area.

5. The display device of claim 4, wherein the common electrode overlaps the first area and the emission area.

6. The display device of claim 1, wherein a width in a first direction of a first group of the cutouts is greater than a width in a second direction crossing the first direction thereof, and a width in the second direction of a remaining group of the cutouts is greater than a width in the first direction thereof, and wherein a group of second areas from among the plurality of second areas are around a first end and a second end of a first cutout from among the first group of the cutouts in the first direction, and are around a first end and a second end of a second cutout from among a remaining group of the cutouts in the second direction.

7. The display device of claim 6, wherein each of the second areas is distinguished by the first area and the cutouts in a plan view.

8. The display device of claim 1, further comprising an encapsulation layer on the common electrode, the first side surface of the first passivation layer, the second surface of the first passivation layer, the first side surface of the first planarization layer, and the second side surface of the first planarization layer, wherein the encapsulation layer directly contacts the second surface of the first passivation layer.

9. The display device of claim 8, wherein the encapsulation layer is over the first area and the second area, and is on the dummy conductive pattern in the second area.

10. The display device of claim 1, wherein the common electrode has a same planar shape as that of the first passivation layer.

11. The display device of claim 1, further comprising a pixel on each of the plurality of islands, wherein each of the plurality of islands has a rectangular shape in a plan view, and a number of pixels per unit area (pixels per inch, ppi) is within a range of 200 to 500.

12. The display device of claim 1, wherein an arrangement pattern of the plurality of islands and the plurality of bridges has an array repeating unit, and the array repeating units are repeatedly arranged along a first direction and a second direction crossing the first direction.

13. The display device of claim 12, wherein the array repeating unit includes a first array repeating unit and a second array repeating unit adjacent to the first array repeating unit in the first direction or the second direction, and the first array repeating unit and the second array repeating unit have a line-symmetric shape.

14. The display device of claim 1, further comprising an impact absorption pattern between the substrate and the dummy conductive pattern in the second area and having an island shape in a plan view.

15. The display device of claim 1, further comprising a spacer on the dummy conductive pattern in the second area.

16. A display device including a first area and a plurality of second areas spaced apart from each other by the first area, wherein, the display device comprising:

a substrate including a plurality of islands distinguished by a plurality of cutouts, and a plurality of bridges respectively disposed between two adjacent islands of the plurality of islands;

a first planarization layer on a surface of the substrate in the first area;

a first passivation layer on the first planarization layer;

a common electrode on the first passivation layer;

a dummy conductive pattern on the substrate in a second area from among the second areas, physically separated from the common electrode, and including a same material as the common electrode, wherein the first area is over the plurality of islands and the plurality of bridges, the common electrode is at a position higher than the dummy conductive pattern with respect to one surface or other surface of the substrate, a first side surface of the first passivation layer protrudes outward from a first side surface of the first planarization layer over the second area from among the second areas, a second side surface of the first passivation layer opposite to the first side surface of the first passivation layer protrudes outward from a second side surface of the first planarization layer opposite to the first side surface of the first planarization layer, the first side surface of the first planarization layer and the second side surface of the first planarization layer do not directly contact the first passivation layer, and the second side surface of the first planarization layer does not overlap the substrate in a direction perpendicular to the surface of the substrate.

17. The display device of claim 16, wherein the second area from among the second areas is around at least one of both ends of a cutout from among the plurality of cutouts.

18. The display device of claim 17, wherein the dummy conductive pattern has an island shape in a plan view.

19. The display device of claim 18, wherein the common electrode and the dummy conductive pattern are electrically insulated from each other.

* * * * *